US012573455B2

(12) United States Patent
Kwon et al.

(10) Patent No.: US 12,573,455 B2
(45) Date of Patent: Mar. 10, 2026

(54) NONVOLATILE MEMORY DEVICE AND METHOD OF CONTROLLING USING TIME DIVISION ENABLE SWITCHES

(71) Applicant: SAMSUNG ELECTRONICS CO., LTD., Suwon-si (KR)

(72) Inventors: Yongseok Kwon, Suwon-si (KR); Jaeduk Yu, Suwon-si (KR); Sangsoo Park, Suwon-si (KR); Jonghoon Park, Suwon-si (KR); Jayang Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 190 days.

(21) Appl. No.: 18/385,073

(22) Filed: Oct. 30, 2023

(65) Prior Publication Data

US 2024/0274206 A1     Aug. 15, 2024

(30) Foreign Application Priority Data

Feb. 10, 2023     (KR) ........................ 10-2023-0017972

(51) Int. Cl.
| | |
|---|---|
| *G11C 16/12* | (2006.01) |
| *G11C 5/14* | (2006.01) |
| *G11C 11/4074* | (2006.01) |
| *G11C 13/00* | (2006.01) |
| *G11C 16/28* | (2006.01) |
| *G11C 16/30* | (2006.01) |
| *G11C 16/32* | (2006.01) |

(52) U.S. Cl.
CPC ............. *G11C 16/12* (2013.01); *G11C 5/147* (2013.01); *G11C 11/4074* (2013.01); *G11C*

*13/0038* (2013.01); *G11C 16/28* (2013.01); *G11C 16/30* (2013.01); *G11C 16/32* (2013.01)

(58) Field of Classification Search
CPC ..... G11C 16/12; G11C 5/147; G11C 11/4074; G11C 13/0038; G11C 16/28; G11C 16/30; G11C 16/32; G11C 16/0483; G11C 16/08; G11C 16/10; G11C 16/0441
See application file for complete search history.

(56) References Cited

U.S. PATENT DOCUMENTS

| | | | |
|---|---|---|---|
| 6,639,427 B2 | 10/2003 | Dray et al. | |
| 7,157,957 B2 | 1/2007 | Kim | |
| 7,542,349 B2 | 6/2009 | Rai et al. | |
| | (Continued) | | |

*Primary Examiner* — Donald HB Braswell
(74) *Attorney, Agent, or Firm* — Sughrue Mion, PLLC

(57) ABSTRACT

The present disclosure provides nonvolatile memory devices including high-voltage switch circuits and methods of controlling the same. In some embodiments, a nonvolatile memory device includes a voltage generator configured to generate a switching source voltage, a plurality of high-voltage switch circuits grouped into a plurality of switching groups and configured to generate a plurality of switch control signals based on the switching source voltage, a conductive path configured to transfer the switching source voltage from the voltage generator to the plurality of high-voltage switch circuits, a plurality of high-voltage switches configured to transfer high voltages based on the plurality of switch control signals, and a control circuit configured to control transition timing of the plurality of switch control signals independently with respect to each of the plurality of switching groups.

19 Claims, 22 Drawing Sheets

(56)                     References Cited

U.S. PATENT DOCUMENTS

| | | | |
|---|---|---|---|
| 8,390,342 B2 | 3/2013 | Jang | |
| 8,841,942 B2 | 9/2014 | Po et al. | |
| 9,641,068 B2 | 5/2017 | Tanzawa | |
| 9,721,667 B2 | 8/2017 | Son et al. | |
| 9,899,091 B2 | 2/2018 | Son et al. | |
| 2021/0405920 A1* | 12/2021 | Lien ................... | G11C 11/5628 |
| 2023/0019022 A1* | 1/2023 | D'alessandro ......... | G11C 7/227 |
| 2023/0137338 A1* | 5/2023 | Chiang ................ | G06F 3/0673 |
| | | | 711/154 |
| 2024/0078025 A1* | 3/2024 | Benisty ................ | G06F 3/0631 |

* cited by examiner

500

F I G. 10

200

SC

VPP

NDH1

PM1

CS2

220

V25

DET

NAND

V25

NDH2

240

V25

NDH3

NDH4

VNEG

CS1

UP

DN

V25

LS

230

VNEG

210

VDD

INV2

VDD

INV1

EN

READ OPERATION

Figure 23:
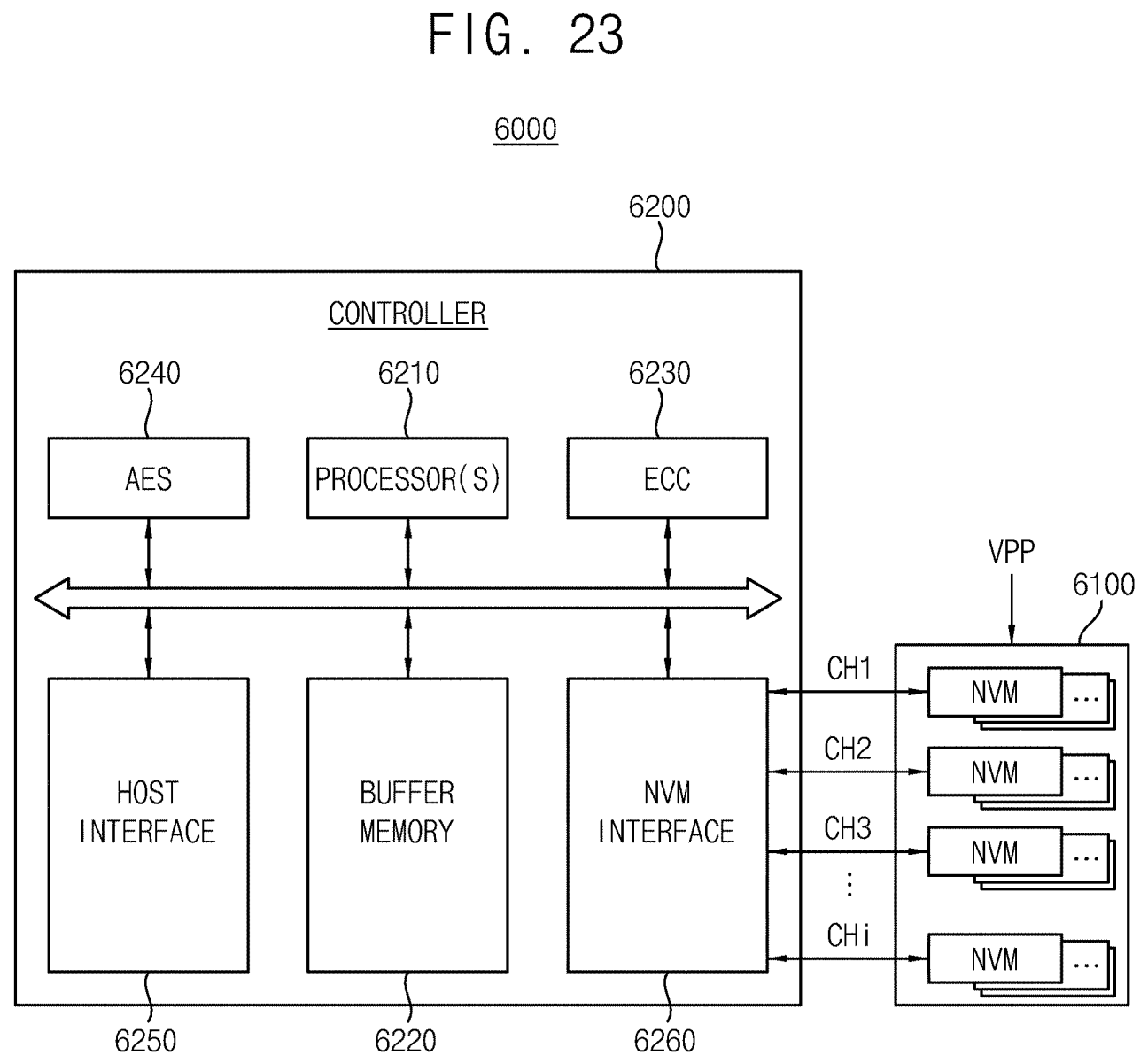

CONTROLLER 6200

AES 6240

PROCESSOR(S) 6210

ECC 6230

HOST INTERFACE 6250

BUFFER MEMORY 6220

NVM INTERFACE 6260

CH1
CH2
CH3
...
CHi

6100

VPP

NVM
NVM
NVM
NVM

NONVOLATILE MEMORY DEVICE AND METHOD OF CONTROLLING USING TIME DIVISION ENABLE SWITCHES

CROSS-REFERENCE TO RELATED APPLICATIONS

This application claims benefit of priority under 35 USC § 119 to Korean Patent Application No. 10-2023-0017972, filed on Feb. 10, 2023, in the Korean Intellectual Property Office, the disclosure of which is incorporated by reference herein in its entirety.

BACKGROUND

1. Field

The present disclosure relates generally to semiconductor integrated circuits, and more particularly to nonvolatile memory devices including high-voltage switch circuits and methods of controlling the nonvolatile memory devices.

2. Description of Related Art

Semiconductor memory devices may be classified into volatile memory devices and/or nonvolatile memory devices, according to whether data stored therein is lost when a power supply is interrupted. Typically, volatile memory devices may have comparatively high reading and/or writing speeds. However, volatile memory devices may have a disadvantage in that content stored therein may disappear when power supply is cut off (e.g., turned off, interrupted). Alternatively or additionally, a nonvolatile memory device may retain its contents even when a power supply is interrupted. Therefore, nonvolatile memory devices may be used to store content that may need to be preserved regardless of whether power is supplied or not. A representative example of a nonvolatile memory device may be and/or may include a flash memory device.

A representative flash memory device may use, in some operations, a high voltage that may be higher than a power supply voltage. For example, a high voltage of about 20 V may be used during program and/or erase operations. As such, a flash memory device may include high-voltage switch circuits for controlling the high voltage provided to flash memory device from outside of the flash memory device.

SUMMARY

Aspects of the present disclosure may provide a nonvolatile memory device and a method of controlling a nonvolatile memory device, capable of reducing and/or preventing a malfunction of high-voltage switch circuits of the nonvolatile memory device.

According to an aspect of the present disclosure, a nonvolatile memory device is provided. The nonvolatile memory device includes a voltage generator configured to generate a switching source voltage, a plurality of high-voltage switch circuits grouped into a plurality of switching groups and configured to generate a plurality of switch control signals based on the switching source voltage, a conductive path configured to transfer the switching source voltage from the voltage generator to the plurality of high-voltage switch circuits, a plurality of high-voltage switches configured to transfer high voltages based on the plurality of switch control signals, and a control circuit configured to control transition timing of the plurality of switch control signals independently with respect to each of the plurality of switching groups.

According to an aspect of the present disclosure, a nonvolatile memory device is provided. The nonvolatile memory device includes a plurality of first bonding metal patterns in a cell region, a plurality of second bonding metal patterns in a peripheral region disposed under the cell region, a memory cell array in the cell region, a voltage generator in the peripheral region, a plurality of high-voltage switch circuits in the peripheral region, a conductive path in the peripheral region, a plurality of high-voltage switches in the peripheral region, and a control circuit in the peripheral region. The peripheral region is vertically coupled to the cell region by the plurality of first bonding metal patterns and the plurality of second bonding metal patterns. The memory cell array includes a plurality of memory blocks. The voltage generator is configured to generate a switching source voltage. The plurality of high-voltage switch circuits is configured to generate a plurality of switch control signals based on the switching source voltage. The plurality of high-voltage switch circuits is grouped into a plurality of switching groups. The conductive path is configured to transfer the switching source voltage from the voltage generator to the plurality of high-voltage switch circuits. The plurality of high-voltage switches is configured to transfer high voltages based on the plurality of switch control signals. The control circuit is configured to control transition timing of the plurality of switch control signals independently with respect to each of the plurality of switching groups.

According to an aspect of the present disclosure, a method of controlling a nonvolatile memory device is provided. The method includes grouping high-voltage switch circuits into a plurality of switching groups. The high-voltage switch circuits generating switch control signals to control high-voltage switches. The method further includes controlling transition timing of the switch control signals independently with respect to each switching group of the plurality of switching groups.

The nonvolatile memory device and the method of controlling the nonvolatile memory device, according to example embodiments, may reduce malfunction of the nonvolatile memory device by reducing a peak current on a conductive path that may transfer the switching source voltage through independent operation control for each switching group of high-voltage switch circuits of the nonvolatile memory device.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which:

FIG. 10 is a diagram illustrating an example embodiment of a high-voltage switch circuit included in a nonvolatile memory device, according to example embodiments;

FIG. 22 is a conceptual diagram illustrating manufacturing processes of a stacked semiconductor device; according to example embodiments; and FIG. 23 is a block diagram illustrating a storage device, according to example embodiments.

DETAILED DESCRIPTION

Figure 1:
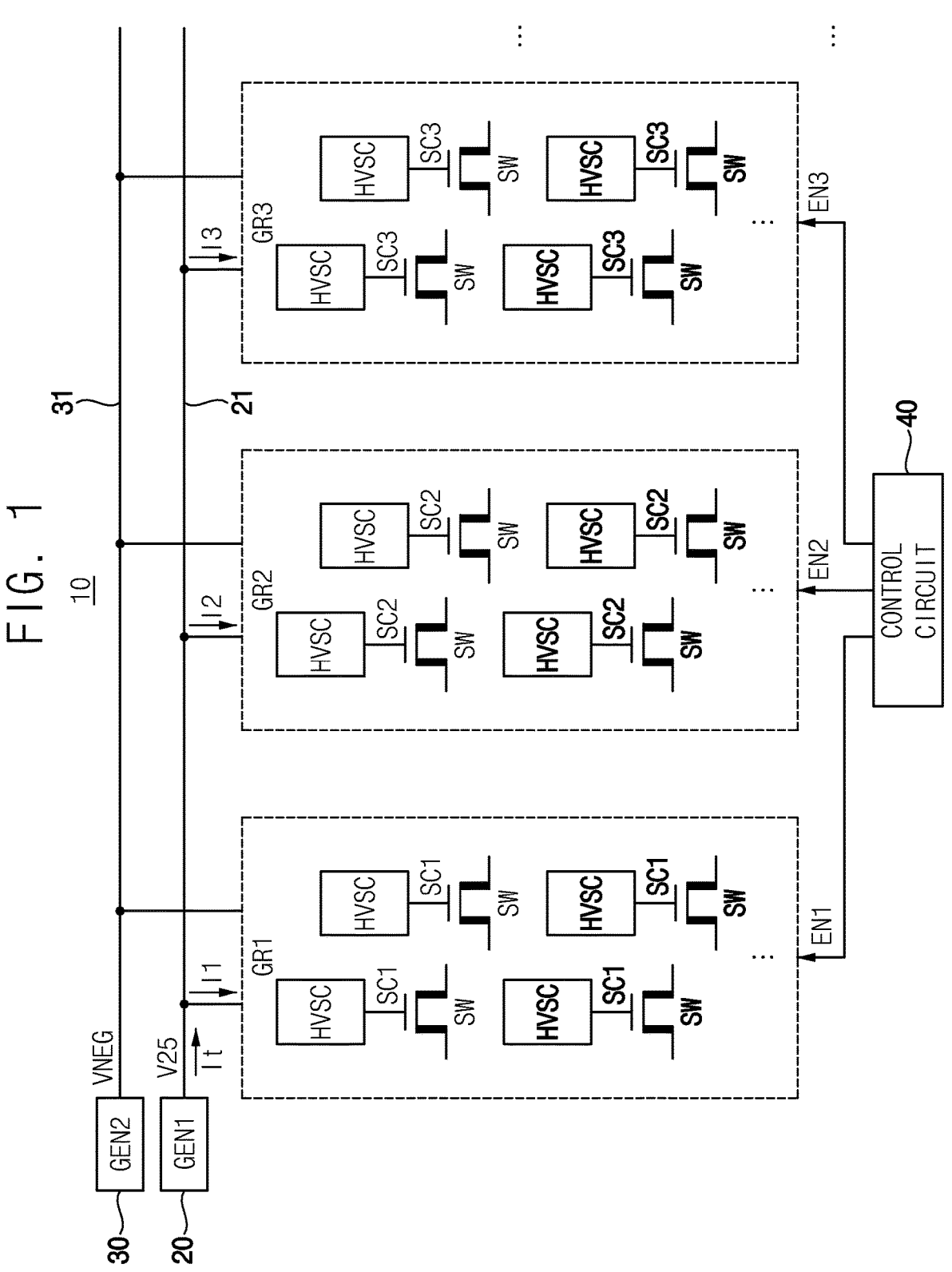
FIG. 1 is a diagram illustrating a nonvolatile memory device, according to example embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

Hereinafter, various embodiments of the present disclosure are described with reference to the accompanying drawings.

FIG. 1 is a diagram illustrating a nonvolatile memory device, according to example embodiments.

Referring to FIG. 1, a nonvolatile memory device 10 may include voltage generators (e.g., first voltage generator CEN1 20 and second voltage generator CEN2 30), conductive paths (e.g., first conductive path 21 and second conductive path 31), a plurality of high-voltage switch circuits HVSC, a plurality of high-voltage switches SW, and a control circuit 40. In FIG. 1, only components for describing example embodiments are briefly illustrated for convenience of illustration and description, and other components may be omitted from the illustration for the sake of clarity. Configuration and operation of the nonvolatile memory device 10 is further described below with reference to FIGS. 6, 7, 8, 9, 13, and 21.

The first voltage generator CEN1 20 may generate a switching source voltage V25. For example, the first voltage generator CEN1 20 may provide the switching source voltage V25 to the plurality of high-voltage switch circuits HVSC through the first conductive path 21.

The second voltage generator CEN2 30 may generate a switching sink voltage VNEG. For example, the second voltage generator CEN2 30 may provide the switching sink voltage VNEG to the plurality of high-voltage switch circuits HVSC through the second conductive path 31.

Although FIG. 1 illustrates an embodiment in which the plurality of high-voltage switch circuits HVSC operate based on the switching source voltage V25 and the switching sink voltage VNEG, the present disclosure is not limited thereto. For example, according to various embodiments, the high-voltage switch circuits HVSC may operate based on the switching source voltage V25 and a ground voltage. In such embodiments, the second voltage generator CEN2 30 may be omitted.

The plurality of high-voltage switch circuits HVSC may generate a plurality of switch control signals (e.g., first switch control signals SC1, second switch control signals SC2, and third switch control signals SC3, hereinafter generally referred to as "SC") based on the switching source voltage V25. In an embodiment, the plurality of high-voltage switches SW may transfer high voltages based on the plurality of switch control signals SC.

The plurality of high-voltage switch circuits HVSC may be grouped into a plurality of switching groups. In an embodiment, as shown in FIG. 1, the plurality of high-voltage switch circuits HVSC may be grouped into a plurality of switching groups (e.g., a first switching group GR1, a second switching group GR2, and a third switching group GR3, hereinafter generally referred to as "GR"). However, the present disclosure is not limited in this regard. For example, the number of the switching groups may be determined variously. That is, the plurality of high-voltage switch circuits HVSC may be grouped into less switching groups (e.g., two (2) or less) or more switching groups (e.g., four (4) or more).

In an embodiment, the high-voltage switch circuits HVSC of the first switching group GR1 may generate the first switch control signals SC1 based on the switching source voltage V25. Alternatively or additionally, the high-voltage switch circuits HVSC of the second switching group GR2 may generate the second switch control signals SC2 based on the switching source voltage V25. In an optional or additional embodiment, the high-voltage switch circuits HVSC of the third switching group GR3 may generate the third switch control signals SC3 based on the switching source voltage V25.

A first sourcing current I1 may be generated when the high-voltage switch circuits HVSC of the first switching group GR1 activate the first switch control signals SC1. Alternatively or additionally, a second sourcing current I2 may be generated when the high-voltage switch circuits HVSC of the second switching group GR2 activate the second switch control signals SC2. For another example, a third sourcing current I3 may be generated when the high-voltage switch circuits HVSC of the third switching group GR3 activate the third switch control signals SC3. A total current It that may be provided by the voltage generator 20 may be a sum of the first sourcing current I1, the second sourcing current I2, and the third sourcing current I3 (e.g., It=I1+I2+I3).

The control circuit 40 may control transition timing of the plurality of switch control signals SC independently with respect to each of the plurality of switching groups GR. For example, the control circuit 40 may generate enable signals (e.g., first enable signals EN1, second enable signals EN2, and third enable signals EN3, hereinafter generally referred to as "EN") to respectively control the transition timing of the plurality of switch control signals SC.

Figure 2:
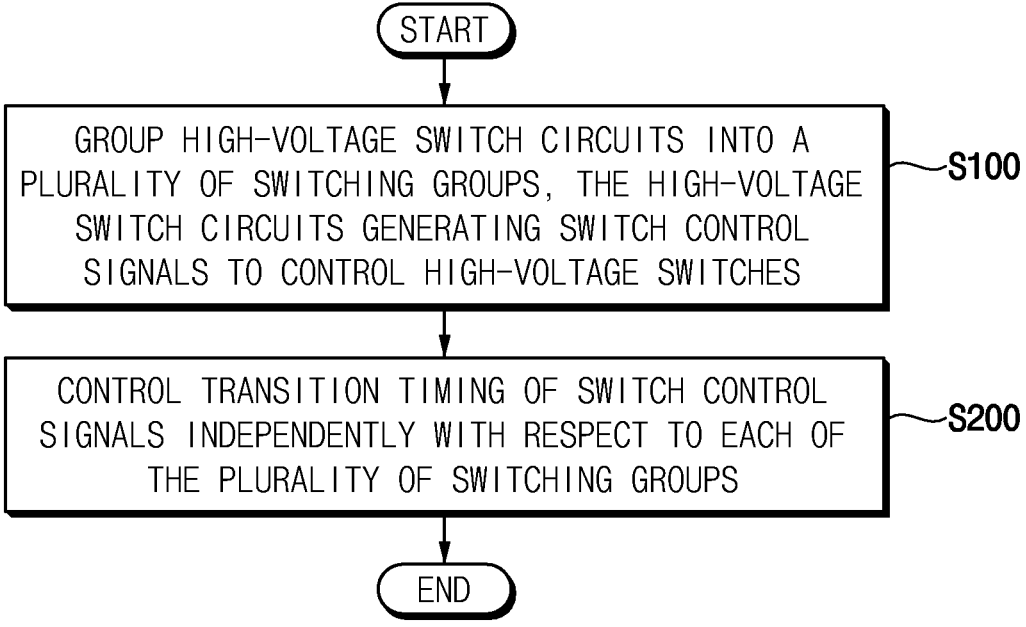
FIG. 2 is a flowchart illustrating a method of controlling a nonvolatile memory device, according to example embodiments.

FIG. 2 is a flowchart illustrating a method of controlling a nonvolatile memory device, according to example embodiments.

Referring to FIGS. 1 and 2, the high-voltage switch circuits HVSC may be grouped into the plurality of switching groups GR such that the high-voltage switch circuits HVSC may generate the switch control signals SC to control the high-voltage switches SW (S100).

The control circuit 40 may control transition timing of the plurality of switch control signals SC independently with respect to each of the plurality of switching groups GR (S200).

In some example embodiments, the control circuit 40 may generate a plurality of enable signals EN that may be provided to the plurality of switching groups GR, respectively. That is, each high-voltage switch circuit HVSC may generate each switch control signal in synchronization with each enable signal provided to a corresponding switching group in which the each high-voltage switch circuit is included.

For example, each high-voltage switch circuit HVSC included in the first switching group GR1 may generate the first switch control signal SC1 in synchronization with the first enable signal EN1 provided to the first switching group GR1. Alternatively or additionally, each high-voltage switch circuit HVSC included in the second switching group GR2 may generate the second switch control signal SC2 in synchronization with the second enable signal EN2 provided to the second switching group GR2. For another example, each high-voltage switch circuit HVSC included in the third switching group GR3 may generate the second switch control signal SC3 in synchronization with the third enable signal EN3 provided to the third switching group GR3. As described with reference to FIGS. 3, 4, and 5, the transition time points of the plurality of switch control signals SC may be controlled independently by independently controlling the transition time points of the plurality of enable signals EN.

Figure 3:
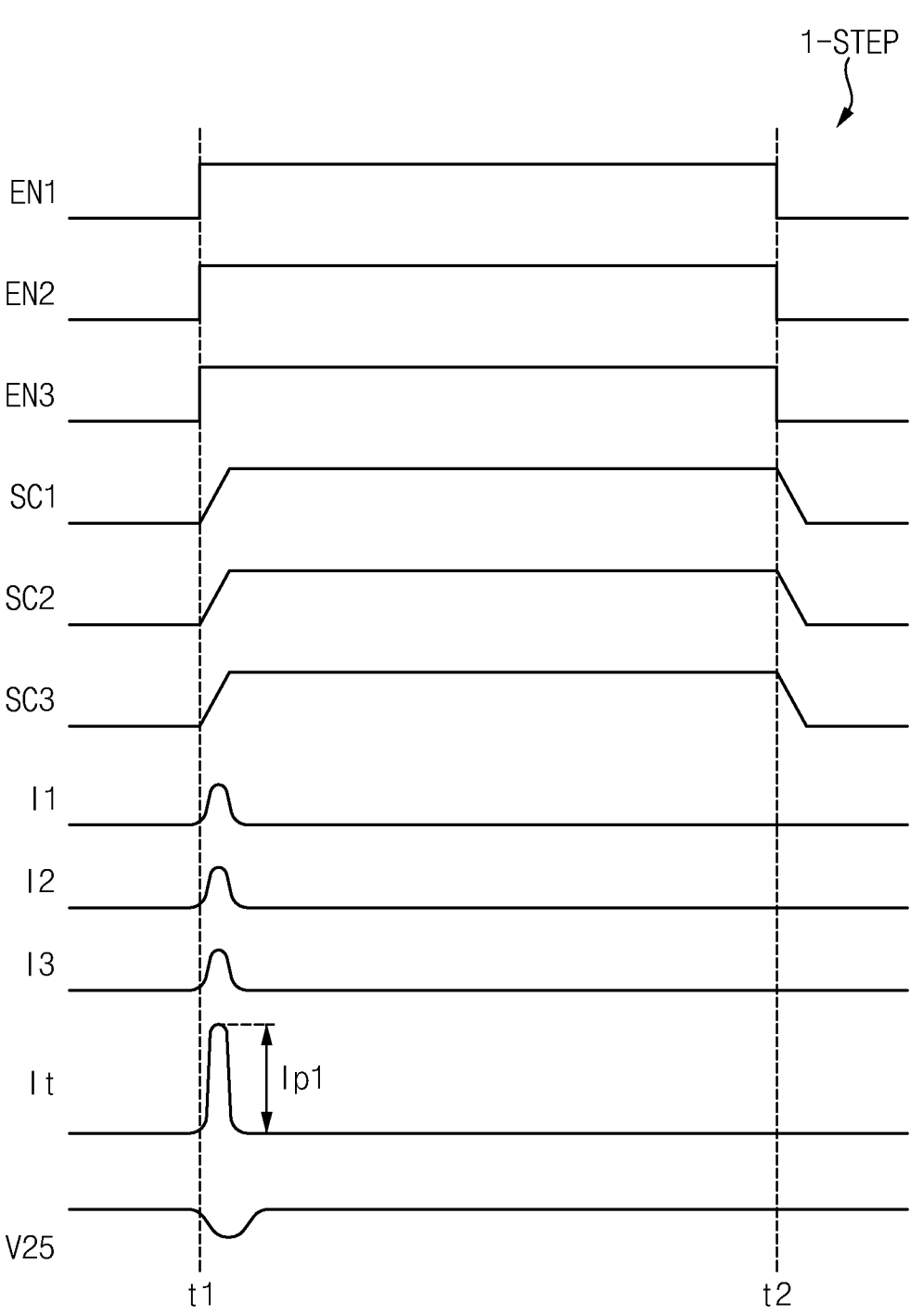
FIG. 3, 4, and 5 are timing diagrams illustrating a method of controlling a nonvolatile memory device, according to example embodiments.
Figure 4:
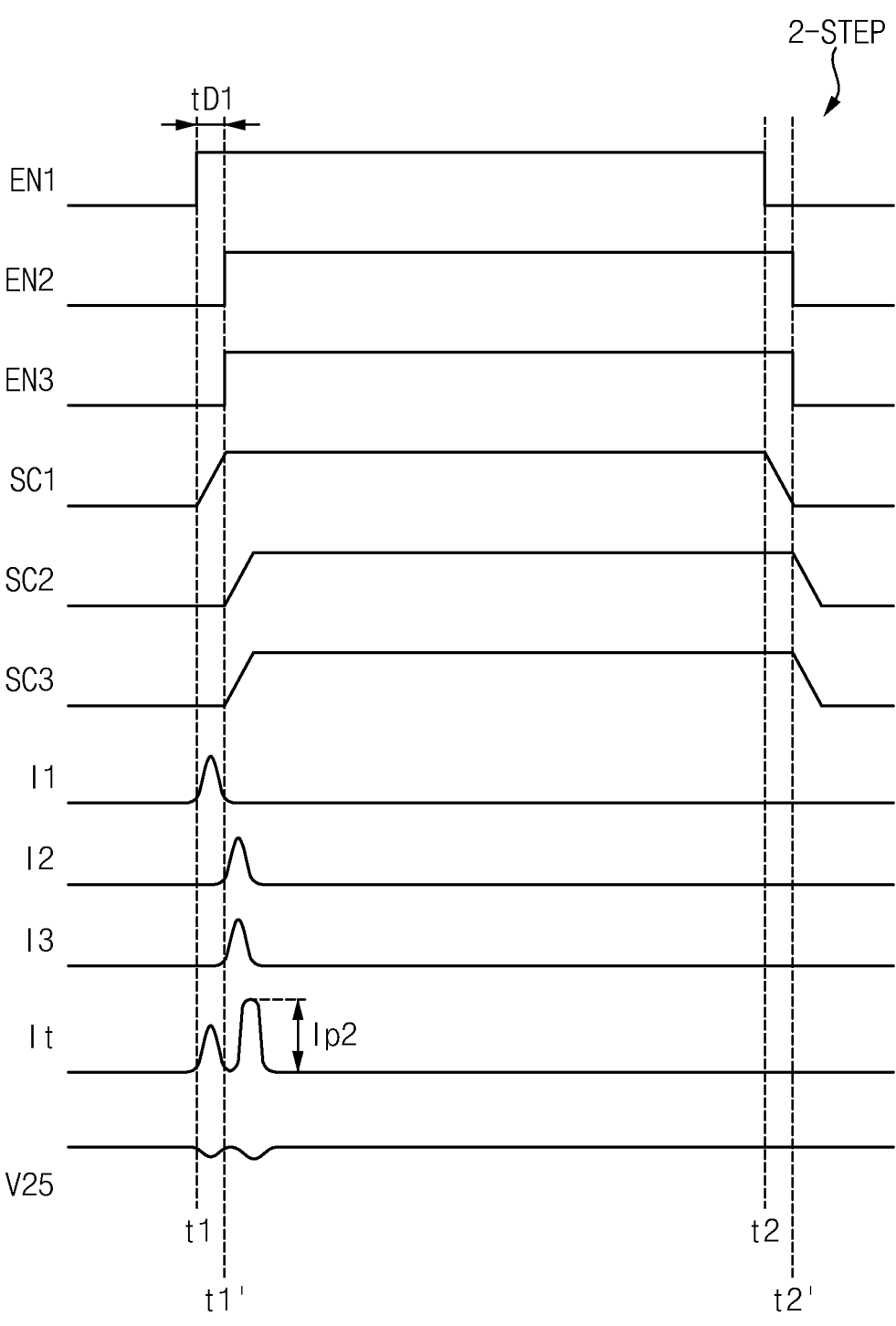
Figure 5:
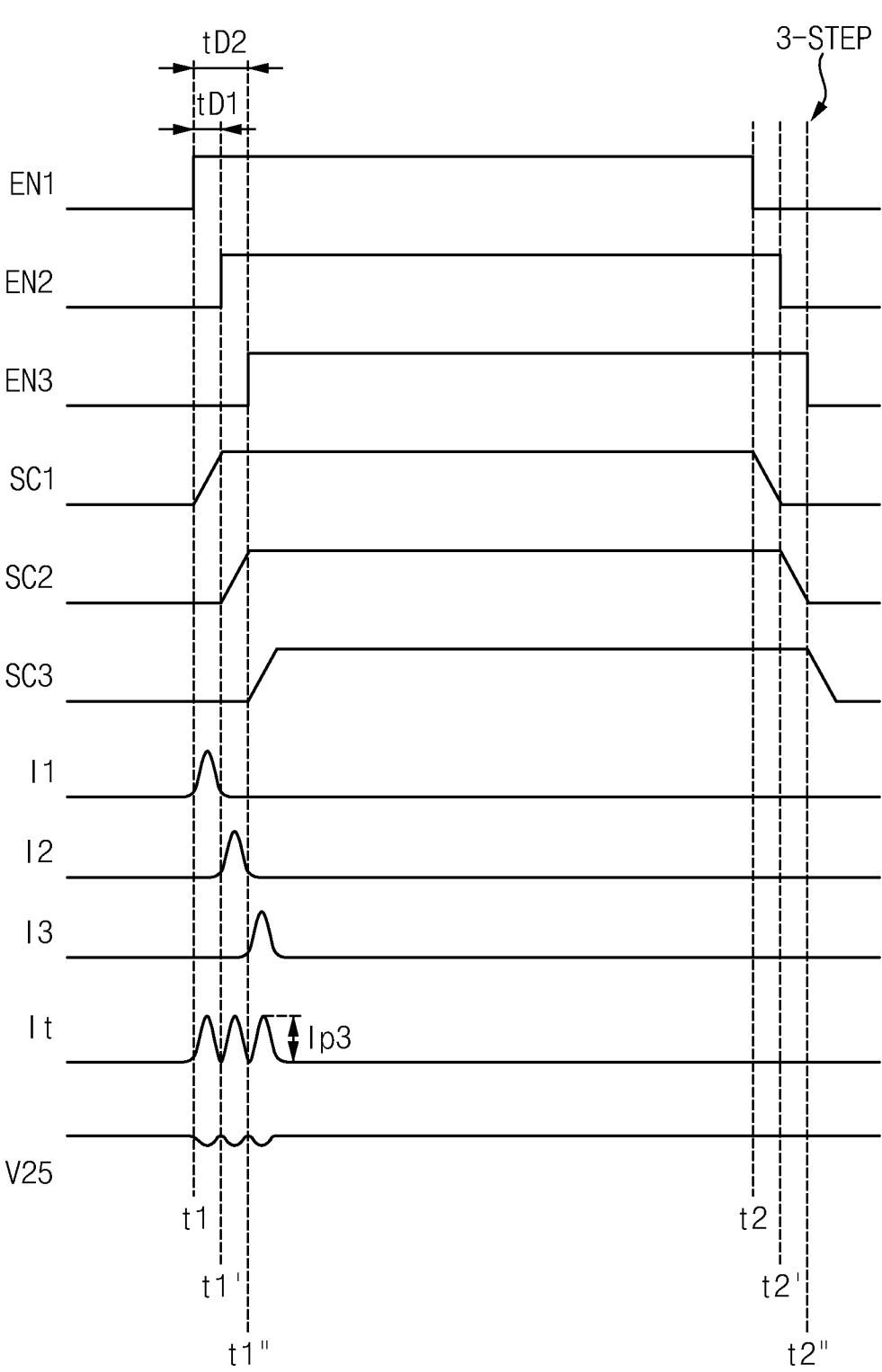

FIGS. 3, 4, and 5 are timing diagrams illustrating a method of controlling a nonvolatile memory device, according to example embodiments.

FIGS. 3, 4, and 5 illustrate example embodiments in which transition time points of the plurality of enable signals EN are differently controlled. FIG. 3 shows a 1-step control in which the plurality of enable signals EN are activated at the same time point t1. FIG. 4 shows a 2-step control in which the plurality of enable signals EN are distributed and activated at two time points t1 and t1'. FIG. 5 illustrates a 3-step control in which the plurality of enable signals EN are distributed and activated at three time points t1, t1' and t1".

For example, in the 2-step control of FIG. 4, the transition time points of the second and third enable signals EN2 and EN3 may be delayed from the first enable signal EN1 by a first delay time tD1. For another example, in the 3-step control of FIG. 5, the transition time points of the second and third enable signals EN2 and EN3 may be delayed from the first enable signals EN1 by a first delay time tD1 and a second delay time tD2, respectively.

In the case of the 1-step control of FIG. 3, activation time points of the plurality of switch control signals SC may be synchronized with the plurality of enable signals EN, respectively, and may be set to one time point t1. In such a case, the plurality of sourcing currents (e.g., first sourcing currents I1, second sourcing currents I2, and third sourcing currents I3) may be generated simultaneously (e.g., at a substantially similar time and/or at a same time), and thus, the peak value Ip1 of the total current It may increase greatly.

In the case of the 2-step control of FIG. 4, since the activation time points of the plurality of switch control signals SC may be distributed to two time points t1 and t1', the plurality of sourcing currents I1 to I3 may be distributed and generated at the two time points t1 and t1'. Consequently, a peak value Ip2 of the total current It may increase to a lower value when compared with the peak value Ip1 of the 1-step control of FIG. 3.

In the case of the 3-step control of FIG. 5, since activation time points of the plurality of switch control signals SC may be distributed to three times points t1, t1' and t1", the plurality of sourcing currents I1 to I3 may be distributed and generated at three time points t1, t1' and t1'. As a result, the peak value Ip3 of the total current It may be lower (e.g., smaller) than the peak value Ip2 of the 2-step control of FIG. 4.

As such, the control circuit 40 may distribute the transition time points of the plurality of enable signals EN by a time-division scheme to reduce the peak current on the conduction path 21 transferring the switching source voltage V25.

As shown in FIGS. 3, 4, and 5, as the peak current on the conductive path 21 increases, the level of the switching source voltage V25 supplied to the high-voltage switch circuits HVSC may drop further. That is, the dipping phenomenon may increase in magnitude. When the level of the switching source voltage V25 drops below a certain level, the switch control signal may not transition normally, and thus, the high-voltage switch may not be turned on normally. As a result, a high voltage that may be needed for operation of the nonvolatile memory device may not be normally transmitted, which may cause a malfunction of the nonvolatile memory device.

In some example embodiments, the control circuit 40 may distribute the transition time points of the plurality of enable signals by a time-division scheme such that the number of the switch control signals that transition simultaneously may be less than or equal to a reference number. In an optional or additional embodiment, the reference number may correspond to a threshold at which the voltage level of the switching source voltage V25 drops to such an extent that a normal transition of the switch control signal may not be performed.

In an embodiment, the reference number may be determined based on the peak current and voltage drop on the conductive path 21 carrying the switching source voltage V25. For example, the reference number may be reduced as the magnitude of the sourcing current generated by each high-voltage switch circuit increases and the wiring resistance on the conductive path 21 increases.

When the number of the switch control signals transitioning simultaneously is less than or equal to the reference number, the control circuit 40 may control and distribute the transition time points of the plurality of enable signals EN to be substantially similar and/or the same as a single time point, according to the 1-step control of FIG. 3. Alternatively or additionally, when the number of switch control signals transitioning simultaneously is greater than the reference number, the control circuit 40 may delay the transition time point of at least one of the plurality of enable signals EN, according to the 2-step control of FIG. 4 and/or the 3-step control of FIG. 5.

That is, the control circuit 40 may control and distribute the rising transition time points t1, t1' and t1" of the plurality of enable signals EN by the time-division scheme such that the number of switch control signals simultaneously activated may be less than or equal to the reference number.

In an embodiment, the sinking currents may be generated from the high-voltage switch circuits HVSC to the conduction path 31 when the switch control signals SC are deactivated. When the peak value of the total current corresponding to the sum of these sinking currents increases, the voltage level of the switching sink voltage VNEG may increase, and the switch control signal may not be normally deactivated.

Therefore, as shown in FIGS. 4 and 5, the control circuit 40 control may and distribute the falling transition time points t1, t1' and t1" of the plurality of enable signals EN by the time-division scheme such that the number of switch control signals that are simultaneously inactivated is less than or equal to the reference number.

Figure 6:
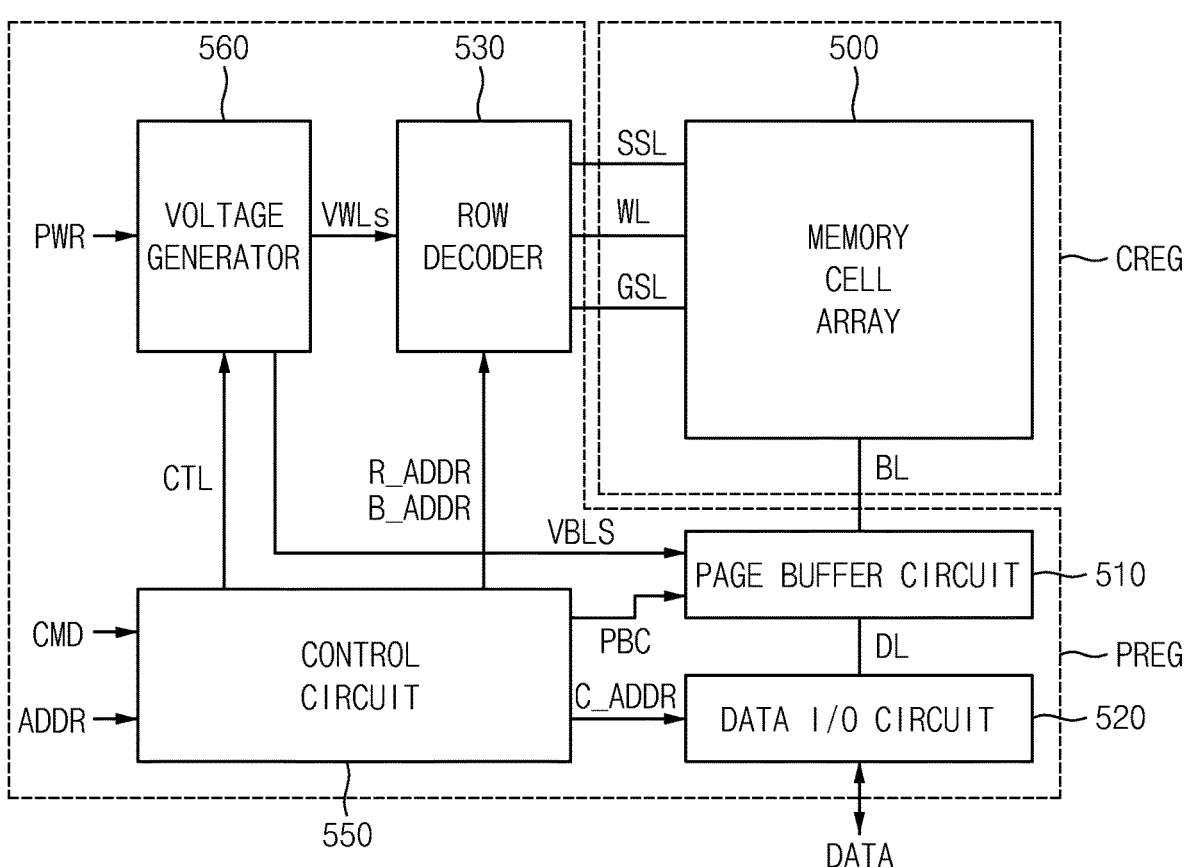
FIG. 6 is a block diagram illustrating a nonvolatile memory device, according to example embodiments.

FIG. 6 is a block diagram illustrating a nonvolatile memory device, according to example embodiments.

Referring to FIG. 6, a nonvolatile memory device 1000 may include a memory cell array 500, a page buffer circuit 510, a data input/output (I/O) circuit 520, a row decoder 530, a control circuit 550, and a voltage generator 560. In some embodiments, the memory cell array 500 may be disposed in a cell region (e.g., cell region CREG in FIG. 21), and the page buffer circuit 510, the data I/O circuit 520, the row decoder 530, the control circuit 550, and the voltage generator 560 may be disposed in a peripheral region (e.g., peripheral region PREG in FIG. 21).

The memory cell array 500 may be coupled to the row decoder 530 through string selection lines SSL, wordlines WL, and ground selection lines GSL. Alternatively or additionally, the memory cell array 500 may be coupled to the page buffer circuit 510 through bitlines BL. The memory cell array 500 may include a plurality of memory blocks and each memory block may include memory cells coupled to the wordlines WL and the bitlines BL. In some example embodiments, the memory cell array 500 may be a three-dimensional (3D) memory cell array, which may be formed on a substrate in a three-dimensional structure (e.g., a vertical structure). For example, the memory cell array 500 may include cell strings (e.g., NAND strings) that may be vertically oriented such that at least one memory cell may be overlapped vertically with another memory cell.

The control circuit 550 may receive a command CMD (e.g., a command signal) and an address ADDR (e.g., an address signal) from a memory controller. Accordingly, the control circuit 550 may control erase, program, and/or read operations of the nonvolatile memory device 1000 in response to (and/or based on) at least one of the command signal CMD and the address signal ADDR. An erase operation may include performing a sequence of erase loops. Alternatively or additionally, a program operation may include performing a sequence of program loops. Each program loop may include a program operation and a program verification operation. Each erase loop may include an erase operation and an erase verification operation. In an optional or additional embodiment, the read operation may include a normal read operation and data recover read operation.

For example, the control circuit 550 may generate the control signals CTL used to control the operation of the voltage generator 560. For another example, the control circuit 550 may generate the page buffer control signal PBC for controlling the page buffer circuit 510 based on the command signal CMD. Alternatively or additionally, the control circuit 550 may generate the block address B_ADDR, the row address R_ADDR, and the column address C_ADDR based on the address signal ADDR. The control circuit 550 may provide the block address B_ADDR and the row address R_ADDR to the row decoder 530. Alternatively or additionally, the control circuit 550 may provide the column address C_ADDR to the data I/O circuit 520.

The row decoder 530 may be coupled to the memory cell array 500 through the string selection lines SSL, the wordlines WL, and the ground selection lines GSL. During the program operation and/or the read operation, the row decoder 530 may determine and/or select one of the wordlines WL as a selected wordline. Alternatively or additionally, the row decoder 530 may determine the remaining wordlines WL except for the selected wordline as unselected wordlines based on the row address R_ADDR.

During the program operation and/or the read operation, the row decoder may determine one of the plurality of memory blocks as a selected memory block and the other memory blocks as unselected memory blocks based on the block address B_ADDR provided from the control circuit 550. Alternatively or additionally, the row decoder 530 may determine one of the string selection lines SSL as a selected string selection line and determine rest of the string selection lines SSL except for the selected string selection line as unselected string selection lines based on the row address R_ADDR.

The voltage generator 560 may generate wordline voltages VWLs and bitline voltages VBLS, which may be needed for the operation of the memory cell array 500 of the nonvolatile memory device 1000, based on the control signals CTL. The voltage generator 560 may receive power PWR from the memory controller. The wordline voltages VWLs may be applied to the wordlines WL through the row decoder 530, and the bitline voltages VBLS may be applied to the bitlines BL through the page buffer circuit 510.

For example, during the erase operation, the voltage generator 560 may apply an erase voltage to a well and/or a common source line of a memory block and may apply an erase permission voltage (e.g., a ground voltage) to all or a portion of the wordlines of the selected memory block based on an erase address. During the erase verification operation, the voltage generator 560 may apply an erase verification voltage simultaneously to all of the wordlines of the selected memory block and/or may apply the erase verification voltage sequentially (e.g., one by one) to the wordlines of the selected memory block.

For another example, during the program operation, the voltage generator 560 may apply a program voltage to the selected wordline and may apply a program pass voltage to the unselected wordlines. Alternatively or additionally, during the program verification operation, the voltage generator 560 may apply a program verification voltage to the first wordline and may apply a verification pass voltage to the unselected wordlines.

During the normal read operation, the voltage generator 560 may apply a read voltage to the selected wordline and/or may apply a read pass voltage to the unselected wordlines. During the data recover read operation, the voltage generator 560 may apply the read voltage to a wordline adjacent to the selected wordline and/or may apply a recover read voltage to the selected wordline.

The page buffer circuit 510 may be coupled to the memory cell array 500 through the bitlines BL. The page buffer circuit 510 may include multiple buffers. In some example embodiments, each buffer may be connected to a single bitline. Alternatively or additionally, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. During the read operation, the data I/O circuit 520 may provide read data DATA, having been read from the memory cell array 500 and stored in the page buffer circuit 510, to the memory controller based on the column address C_ADDR received from the control circuit 550.

In some embodiments, the page buffer circuit 510 and the data I/O circuit 520 may read data from a first area of the memory cell array 500 and write the read data to a second area of the memory cell array 500 (e.g., without transmitting the data to a source external to the nonvolatile memory device 1000, such as to the memory controller). For example, the page buffer circuit 510 and the data I/O circuit 520 may perform a copy-back operation.

Figure 7:
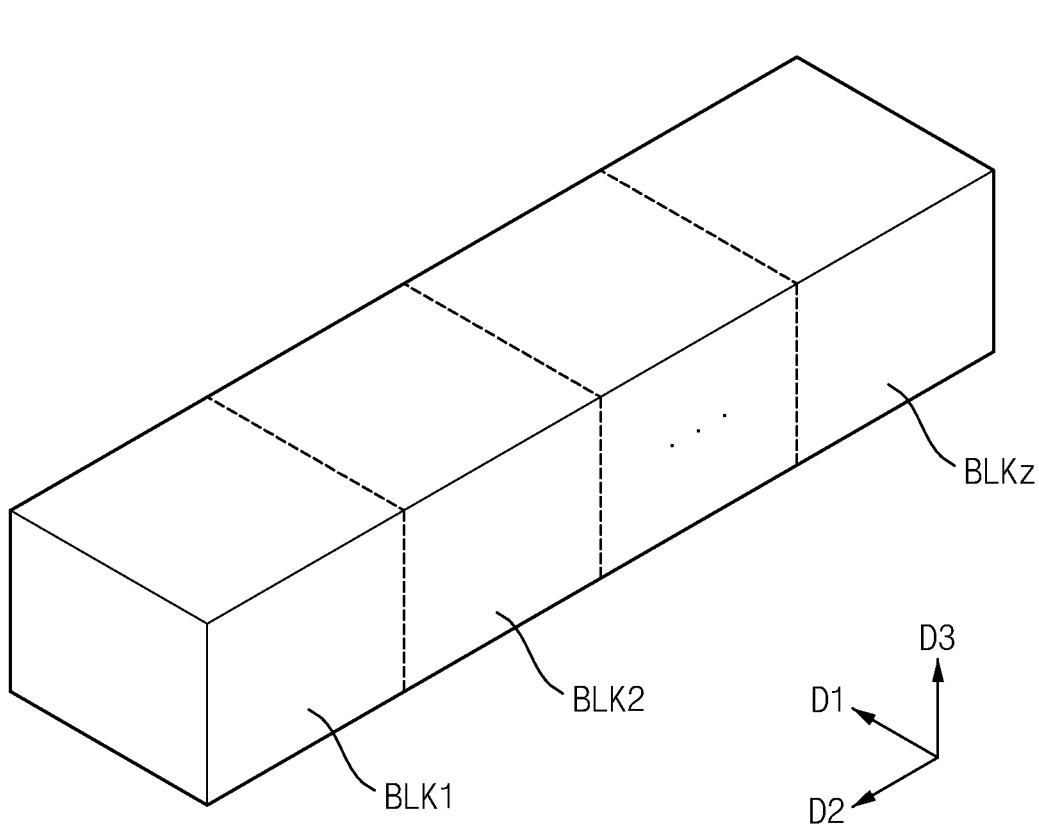
FIG. 7 is a block diagram illustrating a memory cell array included in the nonvolatile memory device of FIG. 6, according to example embodiments.
Figure 8:
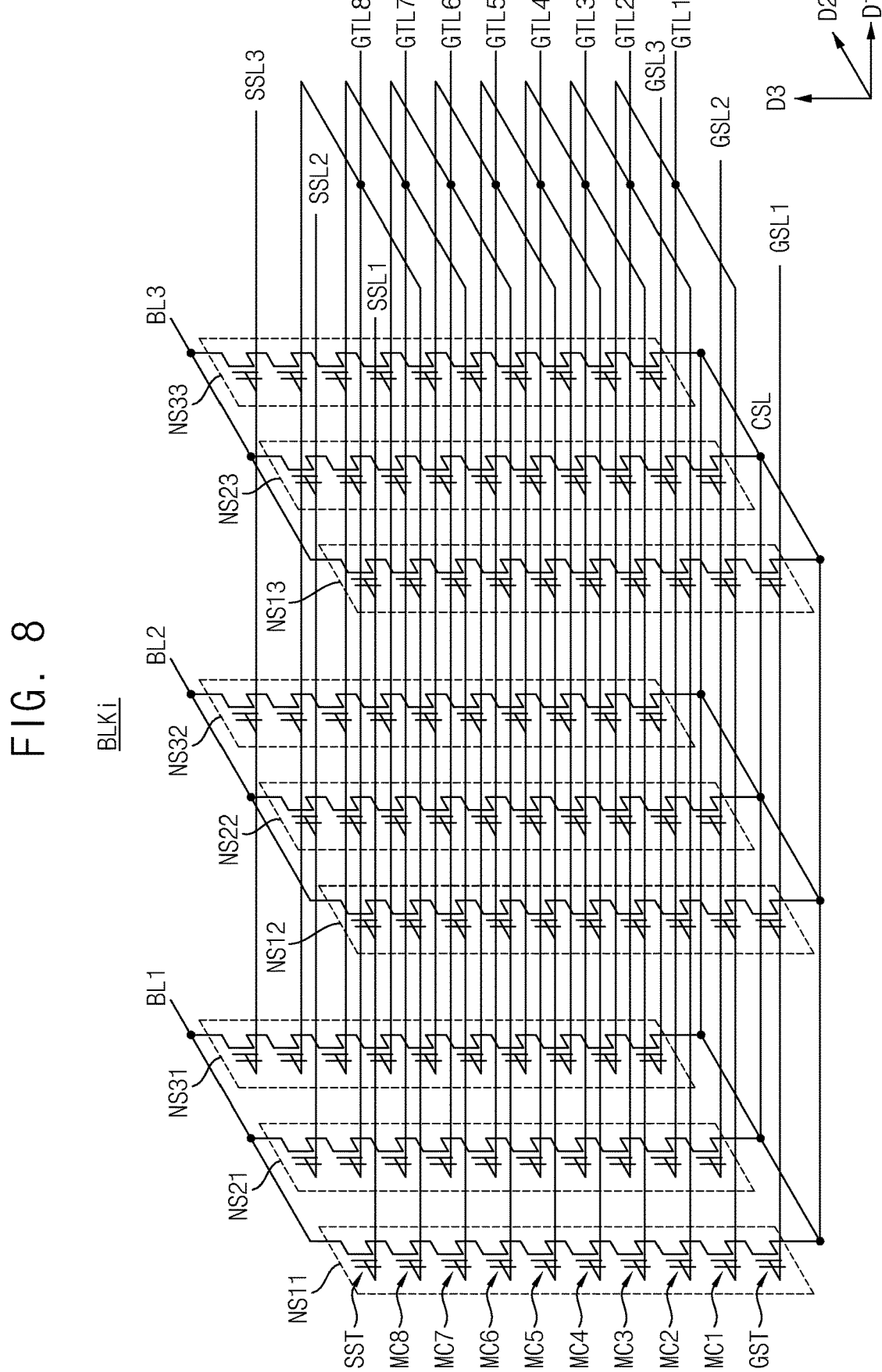
FIG. 8 is a circuit diagram illustrating an equivalent circuit of a memory block included in the memory cell array of FIG. 7, according to example embodiments.

FIG. 7 is a block diagram illustrating a memory cell array included in the nonvolatile memory device of FIG. 6, according to example embodiments. FIG. 8 is a circuit diagram illustrating an equivalent circuit of a memory block included in the memory cell array of FIG. 7, according to example embodiments.

Referring to FIG. 7, the memory cell array 500 may include memory blocks (e.g., first memory block BLK1 to z-th memory block BLKz, where z is a positive integer greater than one (1)). In some example embodiments, the memory blocks BLK1 to BLKz may be selected by a row decoder (e.g., the row decoder 530 of FIG. 6). For example, the row decoder 530 may select a particular memory block corresponding to a block address B_ADDR as the selected memory block among the memory blocks BLK1 to BLKz.

The memory block BLKi of FIG. 8 (where i is a positive integer between one (1) and z) may include and/or may be similar in many respects to at least one of the memory blocks BLK1 to BLKz described above with reference to FIG. 7, and may include additional features not mentioned above. In an embodiment, the memory block BLKi may be formed on a semiconductor substrate in a 3D structure (e.g., a vertical structure). For example, NAND strings and/or cell strings included in the memory block BLKi may be disposed in the vertical direction D3 perpendicular to the upper surface of the substrate.

Referring to FIG. 8, the memory block BLKi may include cell strings and/or NAND strings NS11 to NS33 coupled between bitlines (e.g., first bitline BL1, second bitline BL2, and third bitline BL3) and a common source line CSL. Each NAND string may include a plurality of memory cells stacked in the vertical direction D3, and the plurality of wordlines may be stacked in the vertical direction D3.

Each of the NAND strings NS11 to NS33 may include a string selection transistor SST, memory cells (e.g., first memory cell MC1 to eighth memory cell MC8), and a ground selection transistor GST. In FIG. 8, each of the NAND strings NS11 to NS33 is illustrated to include eight (8) memory cells (e.g., first memory cell MC1 to eighth memory cell MC8). However, the present disclosure is not limited in this regard. For example, in some embodiments, each of the NAND strings NS11 to NS33 may include fewer memory cells (e.g., seven (7) or less) or more memory cells (e.g., nine (9) or more).

Each string selection transistor SST may be connected (e.g., communicatively coupled) to a corresponding string selection line (e.g., one of first string selection line SSL1 to third string selection line SSL3). The first to eighth memory cells MC1 to MC8 may be connected to corresponding gate lines (e.g., first gate line GTL1 to eighth gate line GTL8), respectively. The first to eighth gate lines GTL1 to GTL8 may be wordlines. Alternatively or additionally, some of the first to eighth gate lines GTL1 to GTL8 may be dummy wordlines. Each ground selection transistor GST may be connected to a corresponding ground selection line (e.g., one of first ground selection line GSL1 to third ground selection line GSL3). Each string selection transistor SST may be connected to a corresponding bitline (e.g., one of first bitline BL1, second bitline BL2, and third bitline BL3), and each ground selection transistor GST may be connected to the common source line CSL.

The wordline (e.g., each of the first to eighth gate lines GTL1 to GTL8) having the same height may be commonly connected, and the first to third ground selection lines GSL1 to GSL3 and the first to third string selection lines SSL1 to SSL3 may be separated. In FIG. 8, the memory block BLKi is illustrated to be coupled to eight (8) gate lines (e.g., first gate line GTL1 to eighth gate line GTL8) and three bitlines (e.g., first to third bitlines BL1 to BL3. However, the present disclosure is not limited in this regard. Each memory block in the memory cell array 500 may be coupled to any number of wordlines and any number of bitlines.

Figure 9:
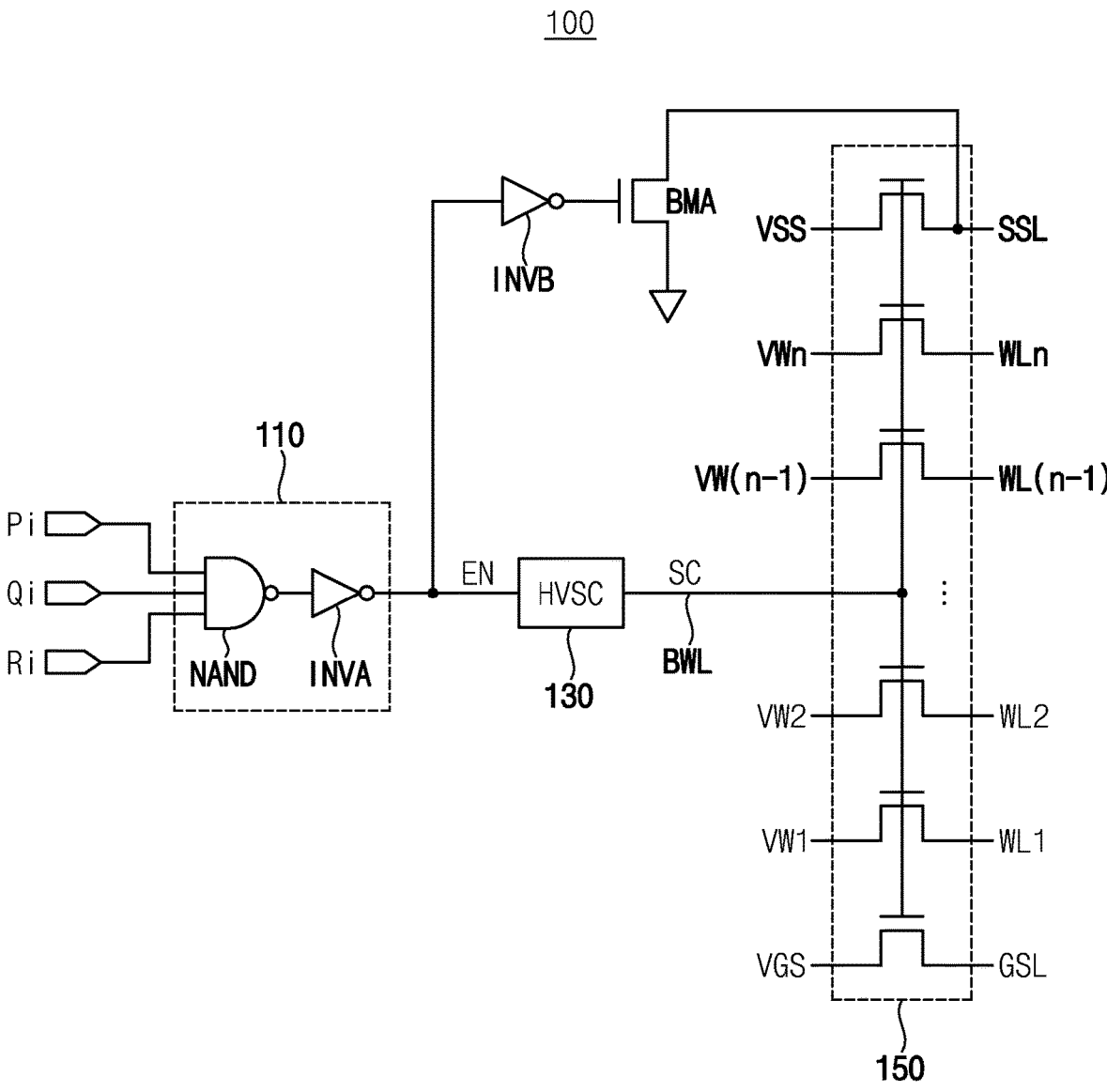
FIG. 9 is a diagram illustrating an example embodiment of a row decoder included in a nonvolatile memory device, according to example embodiments.

FIG. 9 is a diagram illustrating an example embodiment of a row decoder included in a nonvolatile memory device, according to example embodiments.

Referring to FIG. 9, the row decoder 100 may include a decoder 110, a high-voltage switch circuit HVSC 130, and pass transistors 150. In an embodiment, the row decoder 100 may further include an inverter INVB and a switch NMA. The pass transistors 150 may include and/or may be similar in many respects to high-voltage switches SW described above with reference to FIG. 1, and may include additional features not mentioned above.

The decoder 110 may be a block decoder that may select one memory block of the memory cell array. The decoder 110 may include a NAND gate and an inverter INVA.

The NAND gate may perform a NAND logic operation on the decoded signals Pi, Qi, and Ri provided based on the row address R_ADDR. The inverter INVA may invert the output of the NAND gate. An output of the inverter INVA may be transmitted to the node NO as a low-voltage block selection signal, that is, an enable signal EN. In an embodiment, the decoder 110 may further include a component for blocking the output of the NAND gate NAND according to whether the selected block is a bad block.

When all of the decoding signals Pi, Qi, and Ri are activated, the node NO may be set to a high level, and/or the switch BMA for disabling the string selection line SSL may be blocked. The high-voltage switch circuit 130 may output the logic value of the node NO as a high-voltage boosted block selection signal, that is, a switch control signal SC. The block selection signal changed to a high voltage level may be transferred to the block wordline BWL. The pass transistors 150 may be switched by the high-voltage block selection signal transmitted to the block wordline BWL.

The pass transistors 150 transmit the voltages VGS, VW1, VW2, . . . , VW(n−1), VWn, and VSS generated by the voltage generator 560 of FIG. 6 to the wordlines WL1 and WL2, . . . , WL(n−1), WLn and selection lines GSL and SSL, where n is a positive integer greater than one (1). Voltages transmitted by the pass transistors 150 may be relatively high voltages compared to voltages driving general circuits. Accordingly, the pass transistors 150 may be configured as high-voltage transistors driven at a high voltage. A channel of the high-voltage transistor may be formed longer than a channel of the low voltage transistor to withstand a high voltage (e.g., to prevent punch through between a source and a drain). Alternatively or additionally, the gate oxide layer of the high-voltage transistor may be formed to be thicker than the gate oxide layer of the low voltage transistor so as to withstand a high voltage (e.g., to withstand a high potential difference between the gate and the drain/source). That is, high-voltage transistors may require a larger chip area than low voltage transistors.

The high-voltage switch circuit 130 may be implemented in various configurations, and an embodiment thereof is described with reference to FIGS. 10 and 11.

Figure 10:
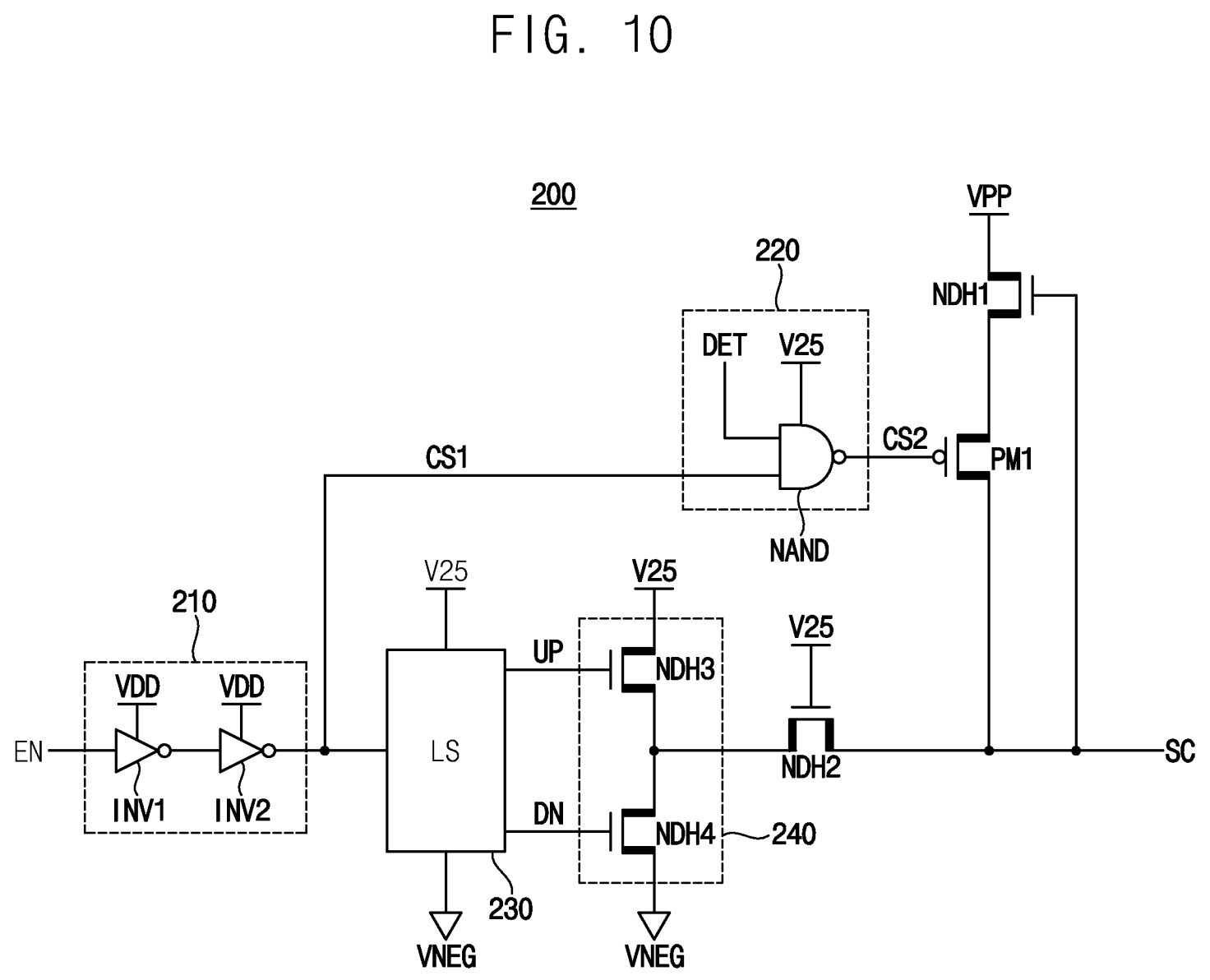

FIG. 10 is a diagram illustrating an example embodiment of a high-voltage switch circuit included in a nonvolatile memory device, according to example embodiments. FIG. 11 is a timing diagram illustrating an operation of the high-voltage switch circuit of FIG. 10, according to example embodiments.

Referring to FIG. 10, a high-voltage switch circuit 200 may include a transistor PM1, a first depletion mode transistor NDH1, a second depletion mode transistor NDH2, an input unit 210, a gate signal generator 220, a level shifter LS 230, and a pull-down circuit 240.

The input unit 210 may include inverters INV1 and INV2 operating based on the power voltage VDD. Alternatively or additionally, the input unit 210 may generate a first control signal CS1 by intensifying the enable signal EN.

The gate signal generator 220 may generate the gate signal CS2 in response to the first control signal CS1 and a second control signal DET. The gate signal generator 220 may include a NAND gate.

The NAND gate may include a first input terminal for receiving the first control signal CS1, a second input terminal for receiving the second control signal DET, and an output terminal for outputting the gate signal CS2. The gate signal CS2 may be generated by performing a NAND operation on the first control signal CS1 and the second control signal DET. The NAND gate may operate in response to the switching source voltage V25, such that the high level of the gate signal CS2 may be substantially equal to the level of the switching source voltage V25.

The pull-down circuit 240 may include a third depletion mode transistor NDH3 and a fourth depletion mode transistor NDH4 that may pull up and down an output node based on the up signal UP and the down signal DN generated from the level shifter 230. As shown in FIG. 11, the up signal UP and the down signal DN may be signals that make complementary transitions between the switching source voltage V25 and the switching sink voltage VNEG.

Figure 11:
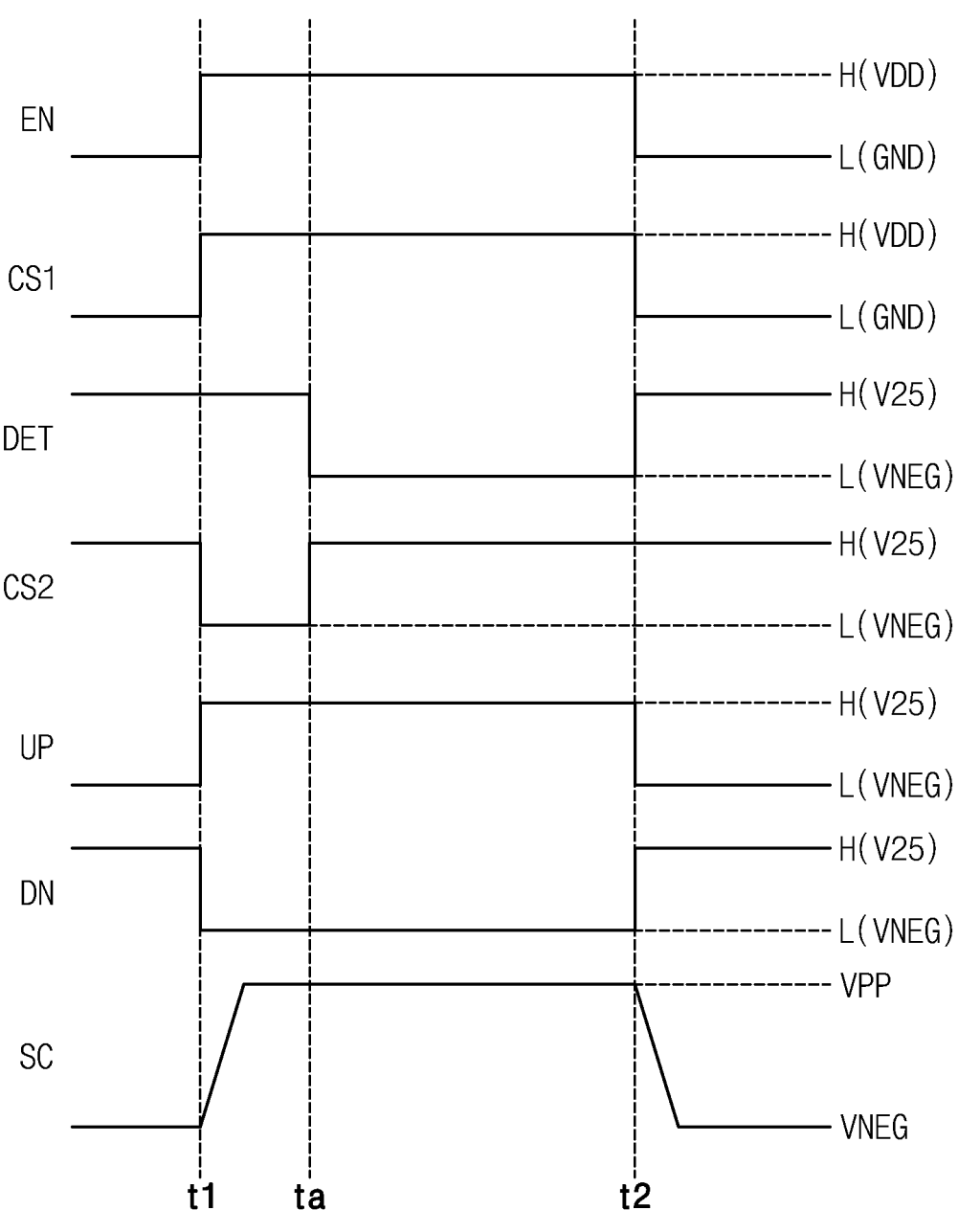
FIG. 11 is a timing diagram illustrating an operation of the high-voltage switch circuit of FIG. 10, according to example embodiments.

In FIG. 11, 'H' may indicate a logic high level of a corresponding signal, and 'L' may indicate a logic low level of the corresponding signal. As shown in FIG. 11, the high-voltage switch circuit 200 may operate in three modes. For example, the high-voltage switch circuit 200 may operate in an off mode, an on mode, and a relaxation mode. Operations in the time period before the time point t1 and after the time point t2 may be operations in the off mode, operations in the time interval between t1 and ta may be operations in the on mode, and operations in the time interval between ta and t2 may be operations in the relaxation mode.

In the off mode, the second control signal DET may be inactive and may have a high level. In addition, the first control signal CS1 may have a low level, and therefore, the NAND gate included in the gate signal generator 220 may perform a NAND operation on the first control signal CS1 and the second control signal DET to generate a high level signal to generate the gate signal CS2 having a high level. The transistor PM1 may be turned off in response to the gate signal CS2.

In the on mode, the second control signal DET may maintain a high level in an inactive state. However, the first control signal CS1 may have a high level, and as a result, the NAND gate may generate the gate signal CS2 having a low level. The transistor PM1 may be turned on in response to the gate signal CS2, and the switch control signal SC may rise to the level of driving voltage VPP by the feedback structure of the transistor PM1 and the first depletion mode transistor NDH1.

After a predetermined time has elapsed from when the enable signal EN has been activated (e.g., when the on mode starts), the second control signal DET may be activated to a low level and the relaxation mode may start. For example, the second control signal DET may be activated after the on mode starts and the rise of the switch control signal SC to the level of the driving voltage VPP may be completed.

In the relaxation mode, the first control signal CS1 may maintain a high level. However, the second control signal DET may have an active low level, and as a result, the NAND gate may generate the gate signal CS2 having a high level. Since the switch control signal SC may have already risen to the level of the driving voltage VPP, the voltage of the first electrode of the transistor PM1 may be set to the driving voltage VPP. Consequently, the gate signal CS2 may have a high level. However, even if the gate signal CS2 has a high level, the transistor PM1 may not be turned off. In addition, as the gate signal CS2 may have a high level, a voltage difference between the first electrode and the gate electrode of the transistor PM1 may be reduced, and deterioration of the transistor PM1 may be reduced and/or prevented.

When the relaxation mode is switched to the off mode, an operation in the time period after time point t2 may be substantially the same as an operation in the time period before time point t1.

Figure 12:
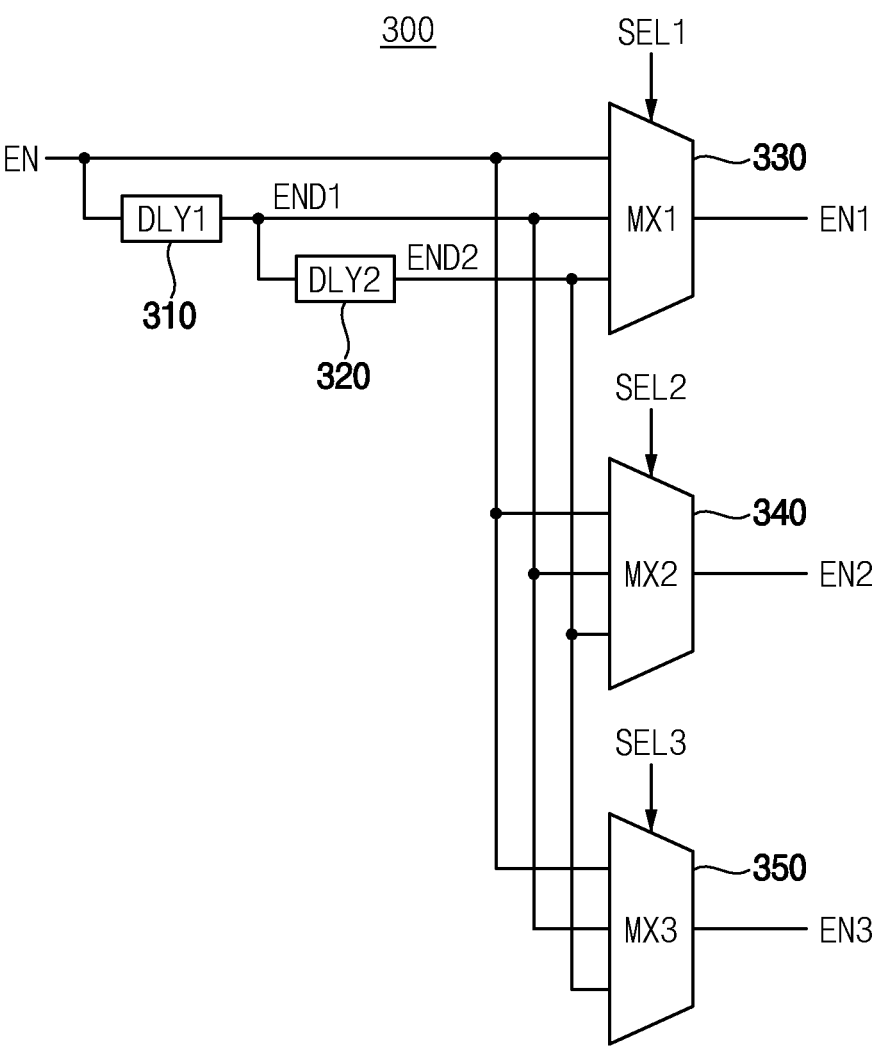
FIG. 12 is a diagram illustrating an example embodiment of a switch group control circuit included in a nonvolatile memory device, according to example embodiments.

FIG. 12 is a diagram illustrating an example embodiment of a switch group control circuit included in a nonvolatile memory device, according to example embodiments.

Referring to FIG. 12, the switch group control circuit 300 may include a plurality of delay circuits (e.g., first delay circuit DLY1 310 and second delay circuit DLY2 320) that may generate one or more delayed enable signals (e.g., first delayed enable signal END1 and second delayed enable signal END2) having different delay times by delaying a reference enable signal EN. The switch group control circuit 300 may further include a plurality of multiplexers (e.g., first multiplexer MX1, second multiplexer MX2, and third multiplexer MX3, hereinafter generally referred to as "MX") that may generate a plurality of enable signals EN by selecting one of the reference enable signal EN and the first and second delayed enable signals END1 and END2, respectively. The plurality of multiplexers MX may perform a selection operation based on the plurality of selection control values (e.g., first selection control value SEL1, second selection control value SEL2, and third selection control value SEL3, hereinafter generally referred to as "SEL"), respectively. The 1-step control, the 2-step control or the 3-step control as described with reference to FIGS. 3, 4, and 5 may be selectively performed by controlling the plurality of selection control values SEL.

Figure 13:
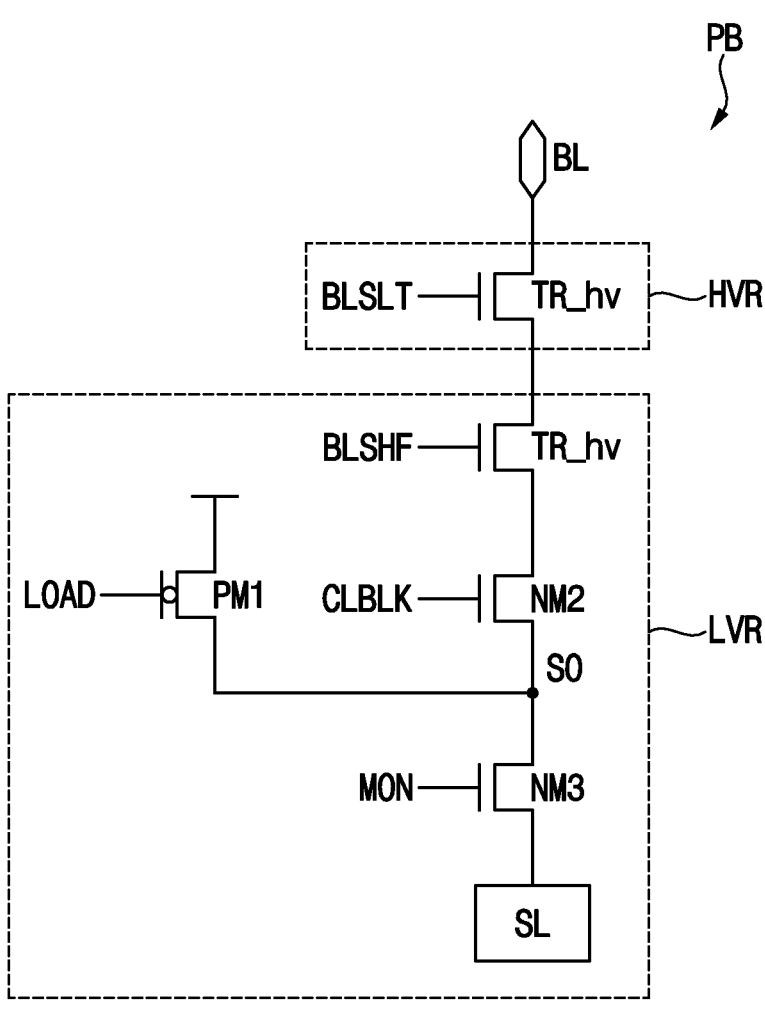
FIG. 13 is a diagram illustrating an example embodiment of a page buffer included in a nonvolatile memory device, according to example embodiments.

FIG. 13 is a diagram illustrating an example embodiment of a page buffer included in a nonvolatile memory device, according to example embodiments.

Referring to FIG. 13, a page buffer PB may be divided into a high voltage region HVR and a low voltage region LVR. In an embodiment, the high voltage region HVR and the low voltage region LVR may be implemented as different well regions. A bitline select transistor TR_hv may be disposed in the high voltage region HVR. Alternatively or additionally, first to third N-channel metal-oxide semiconductor (NMOS) transistors NM1 to NM3, a first P-channel metal-oxide semiconductor (PMOS) transistor PM1, and a sensing latch (SL) may be disposed in the low voltage region LVR. In an embodiment, NMOS transistors and PMOS transistors may be further disposed in the low voltage region LVR. Alternatively or additionally, various latches such as a force latch, an upper bit latch, a lower bit latch, and a cache latch may be further disposed in the low voltage region LRV.

The bitline select transistor TR_hv may be connected to the bitline BL and driven by the bitline select signal BLSLT. The bitline select transistor TR_hv may be implemented as a high-voltage transistor. The first and second NMOS transistors NM1 and NM2 may be connected in series between the bitline select transistor TR_hv and the sensing node SO. The first NMOS transistor NM1 may be driven by the bitline shut-off signal BLSHF. Alternatively or additionally, the second NMOS transistor NM2 may be driven by the bitline connection control signal CLBLK. The first PMOS transistor PM1 may be connected to the sensing node SO, and/or may be driven by the load signal LOAD. Alternatively or additionally, the first PMOS transistor PM1 may precharge the sensing node SO to the precharge level in the precharge period. Accordingly, the first PMOS transistor PM1 may be referred to as a precharge transistor.

The third NMOS transistor NM3 may be connected between the sensing node SO and the sensing latch SL, and/or may be driven by the monitoring signal MON. In some example embodiments, the third NMOS transistor NM3 may be driven by the ground control signal SOGND. The sensing latch SL may store data stored in the memory cell or a result of sensing the threshold voltage of the memory cell during a read or program verify operation.

Alternatively or additionally, the sensing latch SL may be used to apply a program bitline voltage and/or a program inhibit voltage to the bitline BL during a program operation.

Figure 14:
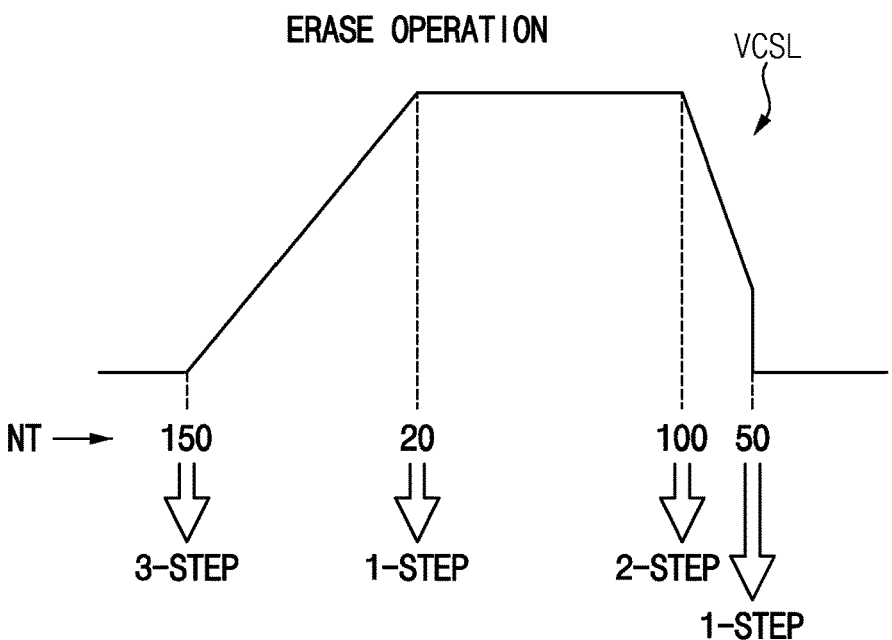
FIGS. 14, 15, and 16 are diagrams illustrating a method of controlling a nonvolatile memory device, according to example embodiments.
Figure 15:
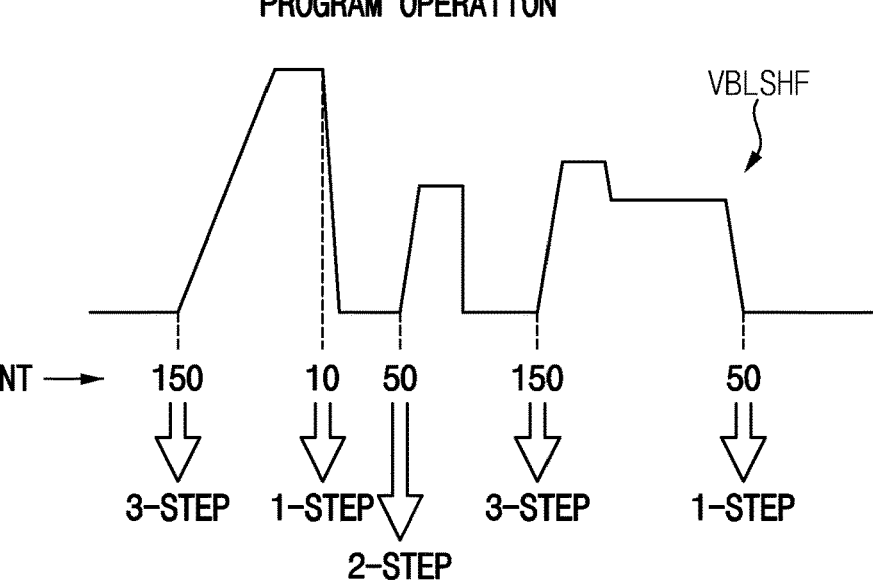
Figure 16:
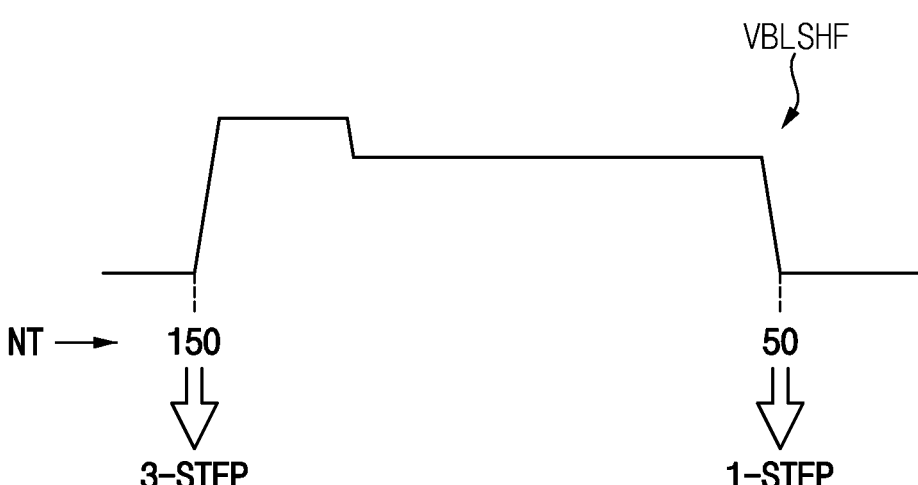

FIGS. 14, 15, and 16 are diagrams illustrating a method of controlling a nonvolatile memory device, according to example embodiments.

FIG. 14 shows an example waveform of a voltage VCSL of the common source line CSL in an erase operation, according to example embodiments. FIG. 15 shows an example waveform of a voltage VBLSHF of the bitline shut-off signal BLSHF in a program operation, according to example embodiments. FIG. 16 shows an example waveform of a voltage VBLSHF of the bitline shut-off signal BLSHF in a read operation.

FIGS. 13, 14, and 15 show the number NT of the switch control signals transitioning simultaneously with respect to each operation time point. For example, the aforementioned reference number may be set to 50. In this case, the 3-step control of FIG. 5 may be performed when the NT is 150, the 2-step control of FIG. 4 may be performed when the NT is 100, and the 1-step control of FIG. 3 may be performed when the NT is 10, 20, and 50.

As such, the control circuit 40 of FIG. 1 may distribute transition time points of the plurality of switch control signals SC by units of switching groups based on the operation time points of the nonvolatile memory device.

Figure 17:
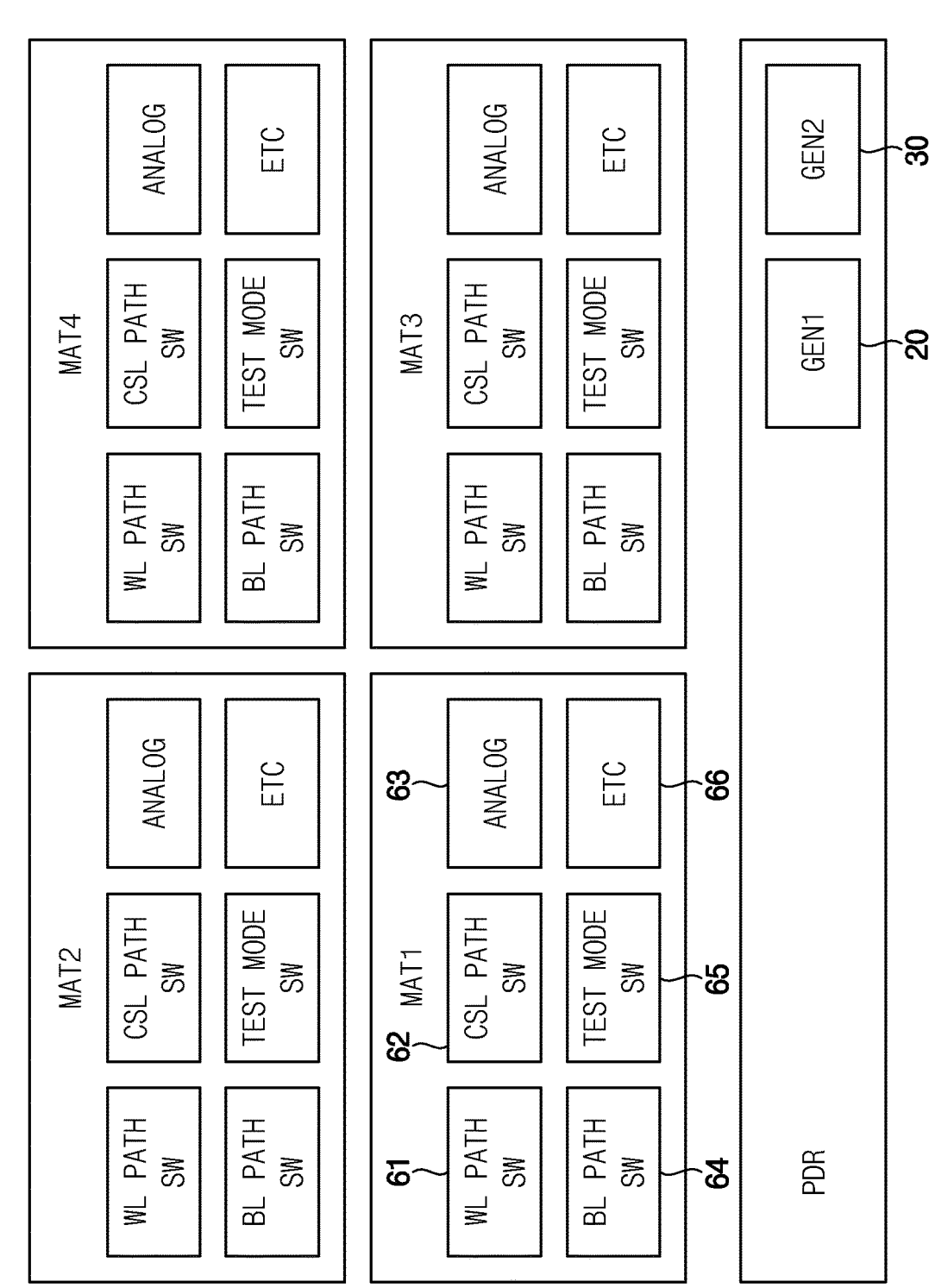
FIGS. 17 and 18 are diagrams illustrating example layouts of a nonvolatile memory device, according to example embodiments.
Figure 18:
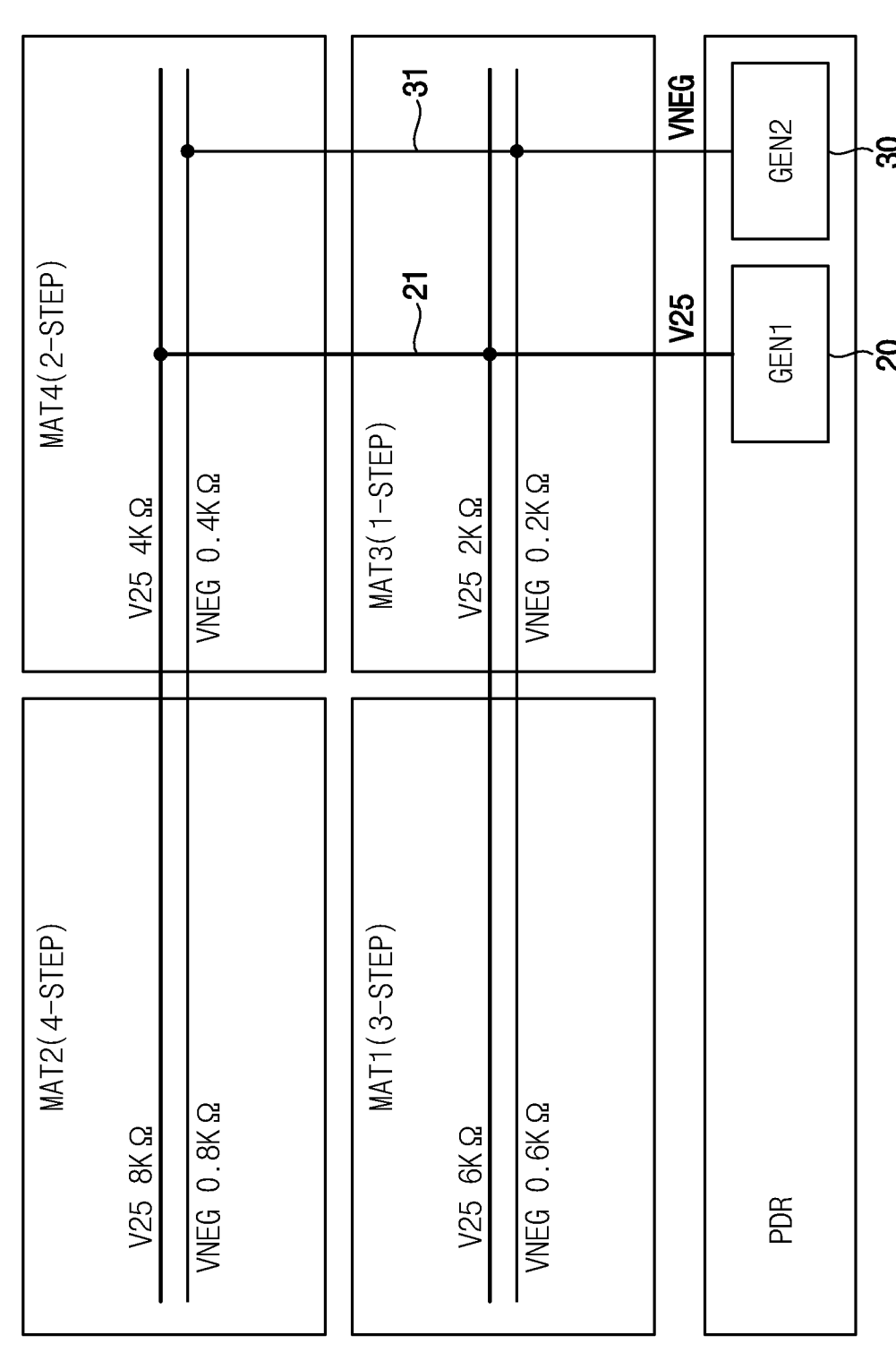

FIGS. 17 and 18 are diagrams illustrating example layouts of a nonvolatile memory device, according to example embodiments.

Referring to FIG. 17, a nonvolatile memory device may include a plurality of mats (e.g., first mat MAT1 to fourth mat MAT4, hereinafter generally referred to as "MAT") having the same configuration and operating independently of each other. Each of the mats MAT may include a wordline path switch circuit 61, a common source line switch circuit 62, an analog circuit 63, a bitline path switch circuit 64, a test mode switch circuit 65, and other circuits ETC 66.

For example, the first and second voltage generators GEN1 20 and GEN2 30 generating the switching source voltage V25 and the switching sink voltage VNEG described above with reference to FIG. 1 may be disposed in the pad region PDR. However, the present disclosure is not limited thereto.

FIG. 18 shows examples of wiring resistances on the first and second conductive paths 21 and 31 between the first and second voltage generators 20 and 30 and the plurality of mats MAT. For example, in the case of the third mat MAT3 closest to the first and second voltage generators 20 and 30, the wiring resistance of the first conductive path 21 delivering the switching source voltage V25 may be about 2 kiloohms (KΩ) and the wiring resistance of the second conductive path 31 delivering the switching sink voltage VNEG may be about 0.2 KΩ. That is, in the case of the second mat MAT2 farthest from the first and second voltage generators 20 and 30, the wiring resistance of the first and second conductive paths 21 and 31 may be about 8 KΩ and 0.8 KΩ, respectively.

As the wiring resistance corresponding to the mat increases, the number of steps of the operation of distributing the transition time points described above may increase. For example, the third mat MAT3 having the smallest wire resistance may perform the 1-step control. The second mat MAT2 having the largest wiring resistance may perform the 4-step control. Alternatively or additionally, the fourth mat MAT4 may perform the 2-step control and the first mat MAT1 may perform the 3-step control.

In this manner, as the wiring resistance on the conductive path between the voltage generator and the mat increases, the high-voltage switch circuits included in the same mat may be grouped into a larger number of switching groups. The transition time points of the plurality of switch control signals may be distributed in units of switching groups based on wiring resistance on the conductive path between the voltage generator and each switching group.

Figure 19:
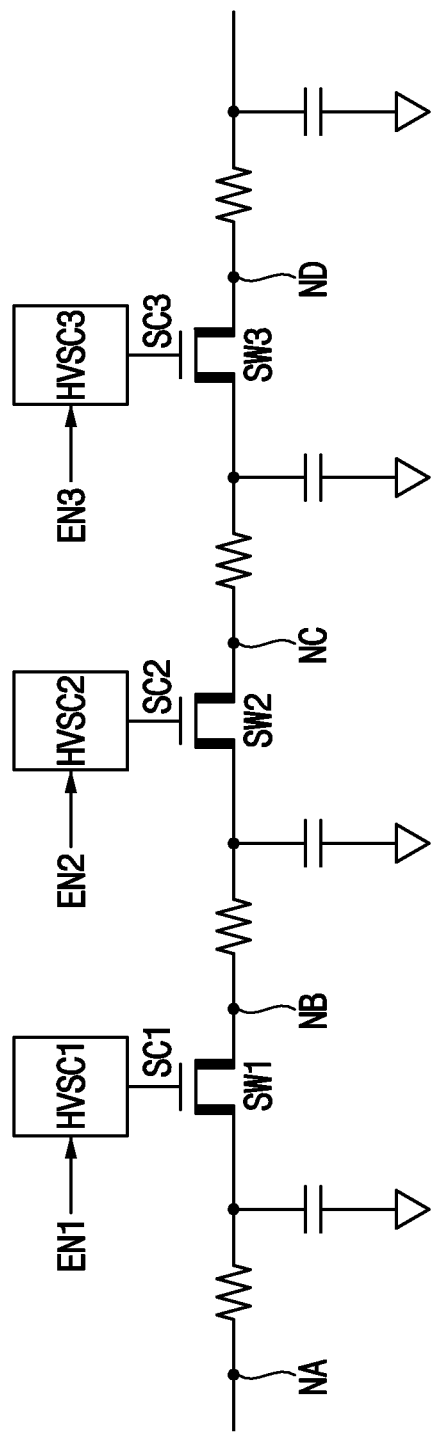
FIG. 19 is a diagram illustrating an example embodiment of a high-voltage transferring path in a nonvolatile memory device, according to example embodiments.
Figure 20:
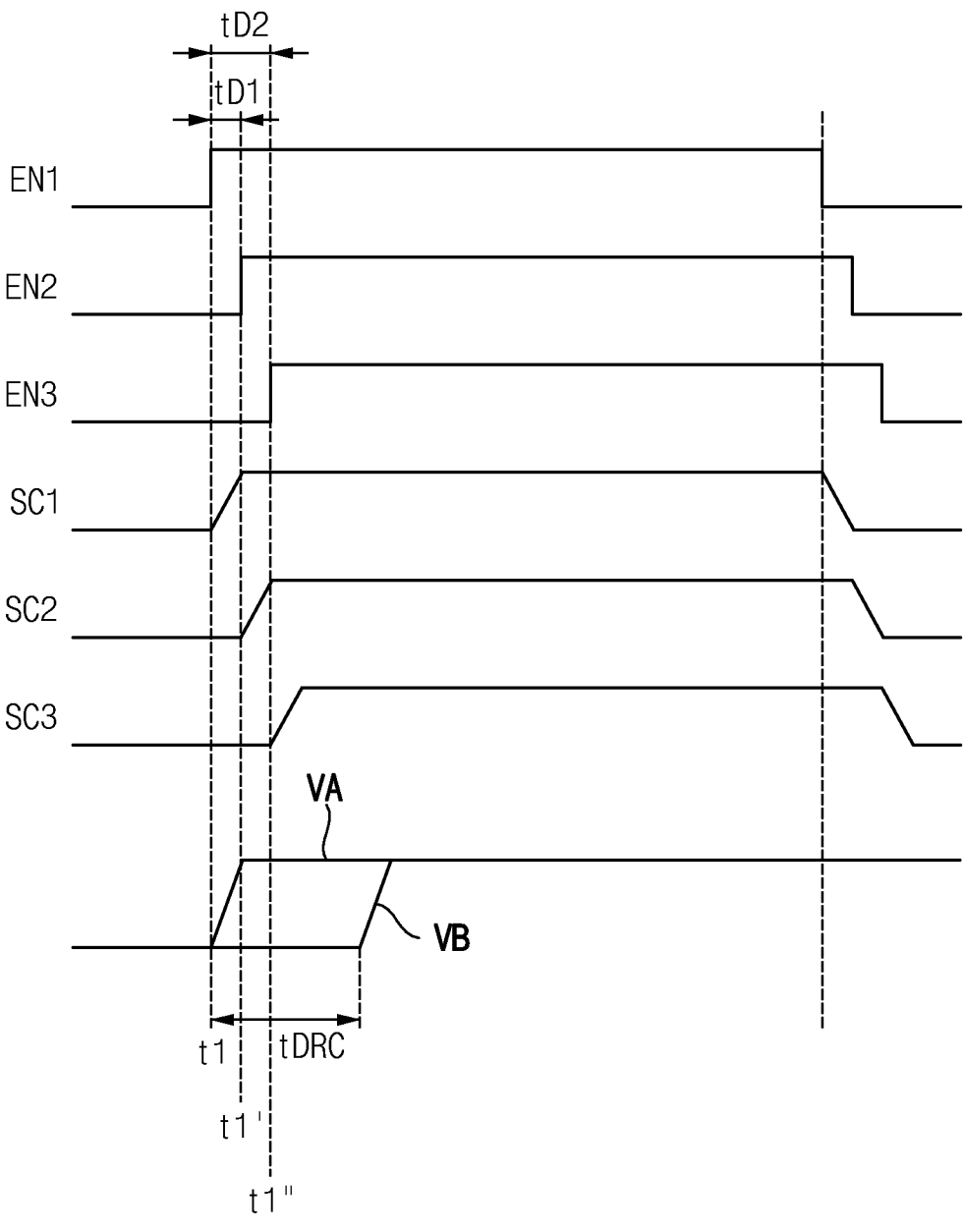
FIG. 20 is a diagram illustrating delay times with respect to the high-voltage transferring path of FIG. 19, according to example embodiments.

FIG. 19 is a diagram illustrating an example embodiment of a high-voltage transferring path in a nonvolatile memory device, according to example embodiments. FIG. 20 is a diagram illustrating delay times with respect to the high-voltage transferring path of FIG. 19, according to example embodiments. The diagram of FIG. 20 may be similar in many respects to the diagram described above with reference to FIG. 5, and may include additional features not mentioned above. As such, descriptions that may be redundant with descriptions provided with reference to FIG. 5 may be omitted for the sake of brevity.

Referring to FIG. 19, for example, the high voltage applied from the node NA may be transferred to the node ND through the nodes NB and NC and the high-voltage transfer path including the voltage switches (e.g., first voltage switch SW1, second voltage switch SW2, and third voltage switch SW3). In FIG. 20, VA and VB may represent voltages at node NA and node NB, respectively.

The first high-voltage switch circuit HVSC1 may generate the first switch control signal SC1 in synchronization with the first enable signal EN1. The second high-voltage switch circuit HVSC2 may generate the second switch control signal SC2 in synchronization with the second enable signal EN2. The third high-voltage switch circuit HVSC3 may generate the third switch control signal SC3 in synchronization with the third enable signal EN3. The first switch SW1 may be turned on in response to the activation of the first switch control signal SC1, the second switch SW2 may be turned on in response to the activation of the second switch control signal SC2, and the third switch SW3 may be turned on in response to activation of the third switch control signal SC3.

FIG. 20 shows the 3-step control described with reference to FIG. 5. In the 3-step control, the transition time points of the second and third enable signals EN2 and EN3 may be delayed from the first enable signal EN1 by the first delay time tD1 and the second delay time tD2, respectively.

As shown in FIG. 20, the maximum delay time tD2 may be set smaller than the RC delay time tDRC on the high-voltage conductive path. In this case, as described above, the transition time points of the switch control signals SC generated by the high-voltage switch circuits HVSC may be distributed and/or delayed without deteriorating performance of the nonvolatile memory device.

Figure 21:
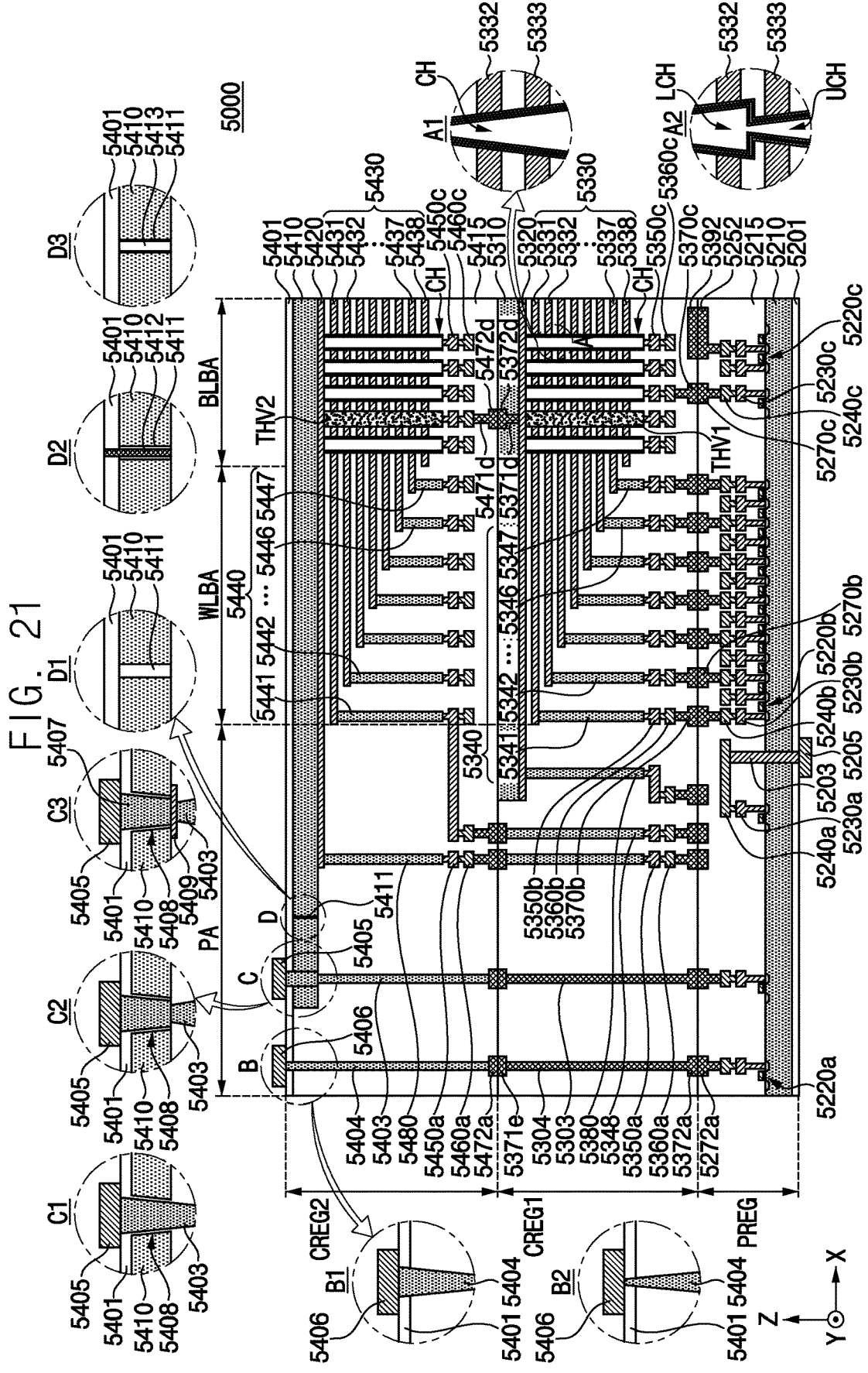
FIG. 21 is a cross-section diagram illustrating a memory device; according to example embodiments.

FIG. 21 is a cross-section diagram illustrating a memory device, according to example embodiments.

Referring to FIG. 21, the memory device 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may refer to a method of electrically and/or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively or additionally, the bonding metal patterns may be formed of other metals including, but not being limited to, aluminum (Al) or tungsten (W).

The memory device 5000 may include the at least one upper chip including the cell region. For example, as shown in FIG. 21, the memory device 5000 may include two upper chips. However, the number of the upper chips is not limited thereto. In the case in which the memory device 5000 includes the two upper chips, a first upper chip that may include a first cell region CREG1, a second upper chip that may include a second cell region CREG2 and the lower chip that may include the peripheral circuit region PREG, may be manufactured separately. Subsequently, the first upper chip, the second upper chip and the lower chip may be connected to each other by the bonding method to manufacture the memory device 5000, for example. In some embodiments, the first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 21. However, the present disclosure is not limited in this regard. For example, in some embodiments, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a wordline bonding region WLBA, and a bitline bonding region BLBA.

The peripheral circuit region PREG may include a first substrate 5210 and a plurality of circuit elements (e.g., first circuit element 5220a, second circuit element 5220b, and third circuit element 5220c) formed on the first substrate 5210. An interlayer insulating layer 5215 including one or more insulating layers may be provided on the plurality of first to third circuit elements 5220a to 5220c, and a plurality of metal lines electrically connected to the plurality of first to third circuit elements 5220a to 5220c may be provided in the interlayer insulating layer 5215. For example, the plurality of metal lines may include first metal lines 5230a, 5230b and 5230c connected to the plurality of first to third circuit elements 5220a to 5220c, and second metal lines 5240a, 5240b, and 5240c formed on the first metal lines 5230a, 5230b, and 5230c. The plurality of metal lines may be formed of at least one of various conductive materials. In some embodiments, the first metal lines 5230a, 5230b, and 5230c may be formed of tungsten having a relatively high electrical resistivity, and the second metal lines 5240a, 5240b, and 5240c may be formed of copper having a relatively low electrical resistivity.

The first metal lines 5230a, 5230b, and 5230c and the second metal lines 5240a, 5240b, and 5240c are illustrated and described in the present embodiments. However, the present disclosure is not limited in this regard. For example, in some embodiments, at least one or more additional metal lines may further be formed on the second metal lines 5240a, 5240b, and 5240c. In this case, the second metal lines 5240a, 5240b, and 5240c may be formed of aluminum, and at least some of the additional metal lines formed on the second metal lines 5240a, 5240b, and 5240c may be formed of copper having an electrical resistivity lower than that of aluminum of the second metal lines 5240a, 5240b, and 5240c.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of wordlines 5330 (e.g., first wordline 5331 to eighth wordline 5338) may be stacked on the second substrate 5310 in a direction (e.g., the Z-axis direction) perpendicular to a top surface of the second substrate 5310. String selection lines and a ground selection line may be disposed on and under the wordlines 5330, and the plurality of wordlines 5330 may be disposed between the string selection lines and the ground selection line. Alternatively or additionally, the second cell region CREG2 may include a third substrate 5410 and a common source line 5420, and a plurality of wordlines 5430 (e.g., first wordline 5431 to eighth wordline 5438) may be stacked on the third substrate 5410 in a direction (e.g., the Z-axis direction) perpendicular to a top surface of the third substrate 5410. Each of the second substrate 5310 and the third substrate 5410 may be formed of at least one of various materials, such as, but not limited to, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some embodiments, as illustrated in a region 'A1', the channel structure CH may be provided in the bitline bonding region BLBA and may extend in the direction perpendicular to the top surface of the second substrate 5310 to penetrate the wordlines 5330, the string selection lines, and the ground selection line. The channel structure CH may include a data storage layer, a channel layer, and a filling insulation layer. The channel layer may be electrically connected to a first metal line 5350c and a second metal line 5360c in the bitline bonding region BLBA. For example, the second metal line 5360c may be a bitline and may be connected to the channel structure CH through the first metal line 5350c. The bitline 5360c may extend in a first direction (e.g., a Y-axis direction) parallel to the top surface of the second substrate 5310.

In some embodiments, as illustrated in a region 'A2', the channel structure CH may include a lower channel LCH and an upper channel UCH, which may be connected to each other. For example, the channel structure CH may be formed by a process of forming the lower channel LCH and a process of forming the upper channel UCH. The lower channel LCH may extend in the direction perpendicular to the top surface of the second substrate 5310 to penetrate the common source line 5320 and first and second lower wordlines 5331 and 5332. The lower channel LCH may include a data storage layer, a channel layer, and a filling insulation layer and may be connected to the upper channel UCH. The upper channel UCH may penetrate third to eighth upper wordlines 5333 to 5338. The upper channel UCH may include a data storage layer, a channel layer, and a filling insulation layer, and the channel layer of the upper channel UCH may be electrically connected to the first metal line 5350c and the second metal line 5360c. As a length of a channel increases, due to characteristics of manufacturing processes, it may be difficult to form a channel having a substantially uniform width. The memory device 5000, according to the present disclosure, may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a wordline located near to a boundary between the lower channel LCH and the upper channel UCH may be a dummy wordline. For example, the second and third wordlines 5332 and 5333 adjacent to the boundary between the lower channel LCH and the upper channel UCH may be the dummy wordlines. In this case, data may not be stored in memory cells connected to the dummy wordline. Alternatively or additionally, the number of pages corresponding to the memory cells connected to the dummy wordline may be less than the number of pages corresponding to the memory cells connected to a general wordline. A level of a voltage applied to the dummy wordline may be different from a level of a voltage applied to the general wordline, and thus, it may be possible to reduce an influence of a non-uniform channel width between the lower and upper channels LCH and UCH on an operation of the memory device.

In some embodiments, the number of the first and second lower wordlines 5331 and 5332 penetrated by the lower channel LCH may be less than the number of the third to eighth upper wordlines 5333 to 5338 penetrated by the upper channel UCH in the region 'A2'. However, the present disclosure is not limited in this regard. For example, in some embodiments, the number of the lower wordlines penetrated by the lower channel LCH may be equal to or more than the number of the upper wordlines penetrated by the upper channel UCH. Alternatively or additionally, structural features and connection relation of the channel structure CH disposed in the second cell region CREG2 may be substantially the same as those of the channel structure CH disposed in the first cell region CREG1.

In the bitline bonding region BLBA, a first through-electrode THV1 may be provided in the first cell region CREG1, and a second through-electrode THV2 may be provided in the second cell region CREG2. As illustrated in FIG. 21, the first through-electrode THV1 may penetrate the common source line 5320 and the plurality of wordlines 5330. In some embodiments, the first through-electrode THV1 may further penetrate the second substrate 5310. The first through-electrode THV1 may include a conductive material. Alternatively or additionally, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 5372d and a second through-metal pattern 5472d. The first through-metal pattern 5372d may be formed at a bottom end of the first upper chip including the first cell region CREG1, and the second through-metal pattern 5472d may be formed at a top end of the second upper chip including the second cell region CREG2. The first through-electrode THV1 may be electrically connected to the first metal line 5350c and the second metal line 5360c. A lower via 5371d may be formed between the first through-electrode THV1 and the first through-metal pattern 5372d, and an upper via 5471d may be formed between the second through-electrode THV2 and the second through-metal pattern 5472d. The first through-metal pattern 5372d and the second through-metal pattern 5472d may be connected to each other by the bonding method.

In some embodiments, in the bitline bonding region BLBA, an upper metal pattern 5252 may be formed in an uppermost metal layer of the peripheral circuit region PERI, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bitline bonding region BLBA, the bitline 5360c may be electrically connected to a page buffer included in the peripheral circuit region PERI. For example, some of the circuit elements 5220c of the peripheral circuit region PREG may constitute the page buffer, and the bitline 5360c may be electrically connected to the circuit elements 5220c constituting the page buffer through an upper bonding metal pattern 5370c of the first cell region CREG1 and an upper bonding metal pattern 5270c of the peripheral circuit region PERI.

Continuing to refer to FIG. 21, in the wordline bonding region WLBA, the wordlines 5330 of the first cell region CREG1 may extend in a second direction (e.g., an X-axis direction) parallel to the top surface of the second substrate 5310 and may be connected to a plurality of cell contact plugs 5340 (e.g., first contact plug 5341 to seventh contact plug 5347). First metal lines 5350b and second metal lines 5360b may be sequentially connected onto the cell contact plugs 5340 connected to the wordlines 5330. In the wordline bonding region WLBA, the cell contact plugs 5340 may be connected to the peripheral circuit region PREG through upper bonding metal patterns 5370b of the first cell region CREG1 and upper bonding metal patterns 5270b of the peripheral circuit region PERI.

The cell contact plugs 5340 may be electrically connected to a row decoder included in the peripheral circuit region PERI. For example, some of the circuit elements 5220b of the peripheral circuit region PREG may constitute the row decoder, and the cell contact plugs 5340 may be electrically connected to the circuit elements 5220b constituting the row decoder through the upper bonding metal patterns 5370b of the first cell region CREG1 and the upper bonding metal patterns 5270b of the peripheral circuit region PERI. In some embodiments, an operating voltage of the circuit elements 5220b constituting the row decoder may be different from an operating voltage of the circuit elements 5220c constituting the page buffer. For example, the operating voltage of the circuit elements 5220c constituting the page buffer may be greater than the operating voltage of the circuit elements 5220b constituting the row decoder.

In some embodiments, in the wordline bonding region WLBA, the wordlines 5430 of the second cell region CREG2 may extend in the second direction (e.g., the X-axis direction) parallel to the top surface of the third substrate 5410 and may be connected to a plurality of cell contact plugs 5440 (e.g., first contact plug 5441 to seventh contact plug 5447). The cell contact plugs 5440 may be connected to the peripheral circuit region PREG through an upper metal pattern of the second cell region CREG2 and lower and upper metal patterns and a cell contact plug 5448 of the first cell region CREG1.

In the wordline bonding region WLBA, the upper bonding metal patterns 5370b may be formed in the first cell region CREG1, and the upper bonding metal patterns 5270b may be formed in the peripheral circuit region PERI. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of at least one metal including, but not limited to, aluminum, copper, and tungsten.

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472*a* of the second cell region CREG2 may be connected to each other by the bonding method in the external pad bonding region PA. In some embodiments, an upper metal pattern 5372*a* may be formed in an upper portion of the first cell region CREG1, and an upper metal pattern 5272*a* may be formed in an upper portion of the peripheral circuit region PERI. The upper metal pattern 5372*a* of the first cell region CREG1 and the upper metal pattern 5272*a* of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350*a* and a second metal line 5360*a* may be sequentially stacked on the common source line contact plug 5380 of the first cell region CREG1, and a first metal line 5450*a* and a second metal line 5460*a* may be sequentially stacked on the common source line contact plug 5480 of the second cell region CREG2.

Input/output pads (e.g., first I/O pad 5205, second I/O pad 5405, and third I/O pad 5406) may be disposed in the external pad bonding region PA. As shown in FIG. 21, a lower insulating layer 5201 may cover a bottom surface of the first substrate 5210, and a first I/O pad 5205 may be formed on the lower insulating layer 5201. The first I/O pad 5205 may be connected to at least one of a plurality of the circuit elements 5220*a* disposed in the peripheral circuit region PREG through a first I/O contact plug 5203 and may be separated from the first substrate 5210 by the lower insulating layer 5201. Alternatively or additionally, a side insulating layer may be disposed between the first I/O contact plug 5203 and the first substrate 5210 to electrically isolate the first I/O contact plug 5203 from the first substrate 5210.

An upper insulating layer 5401 covering a top surface of the third substrate 5410 may be formed on the third substrate 5410. A second I/O pad 5405 and/or a third I/O pad 5406 may be disposed on the upper insulating layer 5401. The second I/O pad 5405 may be connected to at least one of the plurality of circuit elements 5220*a* disposed in the peripheral circuit region PREG through second I/O contact plugs 5403 and 5303, and the third I/O pad 5406 may be connected to at least one of the plurality of circuit elements 5220*a* disposed in the peripheral circuit region PREG through third I/O contact plugs 5404 and 5304.

In some embodiments, the third substrate 5410 may not be disposed in a region in which the I/O contact plug is disposed. For example, as illustrated in a region 'B', the third I/O contact plug 5404 may be separated from the third substrate 5410 in a direction parallel to the top surface of the third substrate 5410 and may penetrate an interlayer insulating layer 5415 of the second cell region CREG2 so as to be connected to the third I/O pad 5406. In this case, the third I/O contact plug 5404 may be formed by at least one of various processes.

In some embodiments, as illustrated in a region 'B1', the third I/O contact plug 5404 may extend in a third direction (e.g., the Z-axis direction), and a diameter of the third I/O contact plug 5404 may become progressively greater (e.g., wider) toward the upper insulating layer 5401. In other words, a diameter of the channel structure CH described in the region 'A1' may become progressively less (e.g., narrower) toward the upper insulating layer 5401, but the diameter of the third I/O contact plug 5404 may become progressively greater toward the upper insulating layer 5401. For example, the third I/O contact plug 5404 may be formed after the second cell region CREG2 and the first cell region CREG1 are bonded to each other by the bonding method.

In some embodiments, as illustrated in a region 'B2', the third I/O contact plug 5404 may extend in the third direction (e.g., the Z-axis direction), and a diameter of the third I/O contact plug 5404 may become progressively less (e.g., narrower) toward the upper insulating layer 5401. In other words, like the channel structure CH, the diameter of the third I/O contact plug 5404 may become progressively less (e.g., narrower) toward the upper insulating layer 5401. For example, the third I/O contact plug 5404 may be formed together with the cell contact plugs 5440 before the second cell region CREG2 and the first cell region CREG1 are bonded to each other.

In some embodiments, the I/O contact plug may overlap with the third substrate 5410. For example, as illustrated in a region 'C', the second I/O contact plug 5403 may penetrate the interlayer insulating layer 5415 of the second cell region CREG2 in the third direction (e.g., the Z-axis direction) and may be electrically connected to the second I/O pad 5405 through the third substrate 5410. In this case, a connection structure of the second I/O contact plug 5403 and the second I/O pad 5405 may be realized by various methods.

In some embodiments, as illustrated in a region 'C1', an opening 5408 may be formed to penetrate the third substrate 5410, and the second I/O contact plug 5403 may be connected directly to the second I/O pad 5405 through the opening 5408 formed in the third substrate 5410. In this case, as illustrated in the region 'C1', a diameter of the second I/O contact plug 5403 may become progressively greater (e.g., wider) toward the second I/O pad 5405. However, the present disclosure is not limited in this regard. For example, in some embodiments, the diameter of the second I/O contact plug 5403 may become progressively less (e.g., narrower) toward the second I/O pad 5405.

In some embodiments, as illustrated in a region 'C2', the opening 5408 penetrating the third substrate 5410 may be formed, and a contact 5407 may be formed in the opening 5408. An end of the contact 5407 may be connected to the second I/O pad 5405, and another end of the contact 5407 may be connected to the second I/O contact plug 5403. Thus, the second I/O contact plug 5403 may be electrically connected to the second I/O pad 5405 through the contact 5407 in the opening 5408. In this case, as illustrated in the region 'C2', a diameter of the contact 5407 may become progressively greater (e.g., wider) toward the second I/O pad 5405, and a diameter of the second I/O contact plug 5403 may become progressively less (e.g., narrower) toward the second I/O pad 5405. For example, the second I/O contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In some embodiments illustrated in a region 'C3', a stopper 5409 may further be formed on a bottom end of the opening 5408 of the third substrate 5410, as compared with the embodiments of the region 'C2'. The stopper 5409 may be a metal line formed in the same layer as the common source line 5420. Alternatively or additionally, the stopper 5409 may be a metal line formed in the same layer as at least one of the wordlines 5430. The second I/O contact plug 5403 may be electrically connected to the second I/O pad 5405 through the contact 5407 and the stopper 5409.

Similar to the second and third I/O contact plugs 5403 and 5404 of the second cell region CREG2, a diameter of each of the second and third I/O contact plugs 5303 and 5304 of the first cell region CREG1 may become progressively less (e.g., narrower) toward the lower metal pattern 5371*e* and/or may become progressively greater (e.g., wider) toward the lower metal pattern 5371*e*.

In some embodiments, a slit 5411 may be formed in the third substrate 5410. For example, the slit 5411 may be formed at a certain position of the external pad bonding region PA. For example, as illustrated in a region 'D', the slit 5411 may be located between the second I/O pad 5405 and the cell contact plugs 5440 when viewed in a plan view. Alternatively or additionally, the second I/O pad 5405 may be located between the slit 5411 and the cell contact plugs 5440 when viewed in a plan view.

In some embodiments, as illustrated in a region 'D1', the slit 5411 may be formed to penetrate the third substrate 5410. For example, the slit 5411 may be used to prevent the third substrate 5410 from being finely cracked when the opening 5408 is formed. However, the present disclosure is not limited in this regard. For example, in some embodiments, the slit 5411 may be formed to have a depth ranging from about 60% to about 70% of a thickness of the third substrate 5410.

In some embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside. In this case, the conductive material 5412 may be connected to an external ground line.

In some embodiments, as illustrated in a region 'D3', an insulating material 5413 may be formed in the slit 5411. For example, the insulating material 5413 may be used to electrically isolate the second I/O pad 5405 and the second I/O contact plug 5403 disposed in the external pad bonding region PA from the wordline bonding region WLBA. Since the insulating material 5413 is formed in the slit 5411, it may be possible to prevent a voltage provided through the second I/O pad 5405 from affecting a metal layer disposed on the third substrate 5410 in the wordline bonding region WLBA.

In some embodiments, the first to third I/O pads 5205, 5405 and 5406 may be selectively formed. For example, the memory device 5000 may be realized to include only the first I/O pad 5205 disposed on the first substrate 5210, to include only the second I/O pad 5405 disposed on the third substrate 5410, and/or to include only the third I/O pad 5406 disposed on the upper insulating layer 5401.

In some embodiments, at least one of the second substrate 5310 of the first cell region CREG1 and the third substrate

5410 of the second cell region CREG2 may be used as a sacrificial substrate and may be completely and/or partially removed before and/or after a bonding process. An additional layer may be stacked after the removal of the substrate. For example, the second substrate 5310 of the first cell region CREG1 may be removed before and/or after the bonding process of the peripheral circuit region PREG and the first cell region CREG1. Subsequently, an insulating layer covering a top surface of the common source line 5320 or a conductive layer for connection may be formed. Similarly, the third substrate 5410 of the second cell region CREG2 may be removed before and/or after the bonding process of the first cell region CREG1 and the second cell region CREG2, and subsequently, the upper insulating layer 5401 covering a top surface of the common source line 5420 or a conductive layer for connection may be formed.

Figure 22:
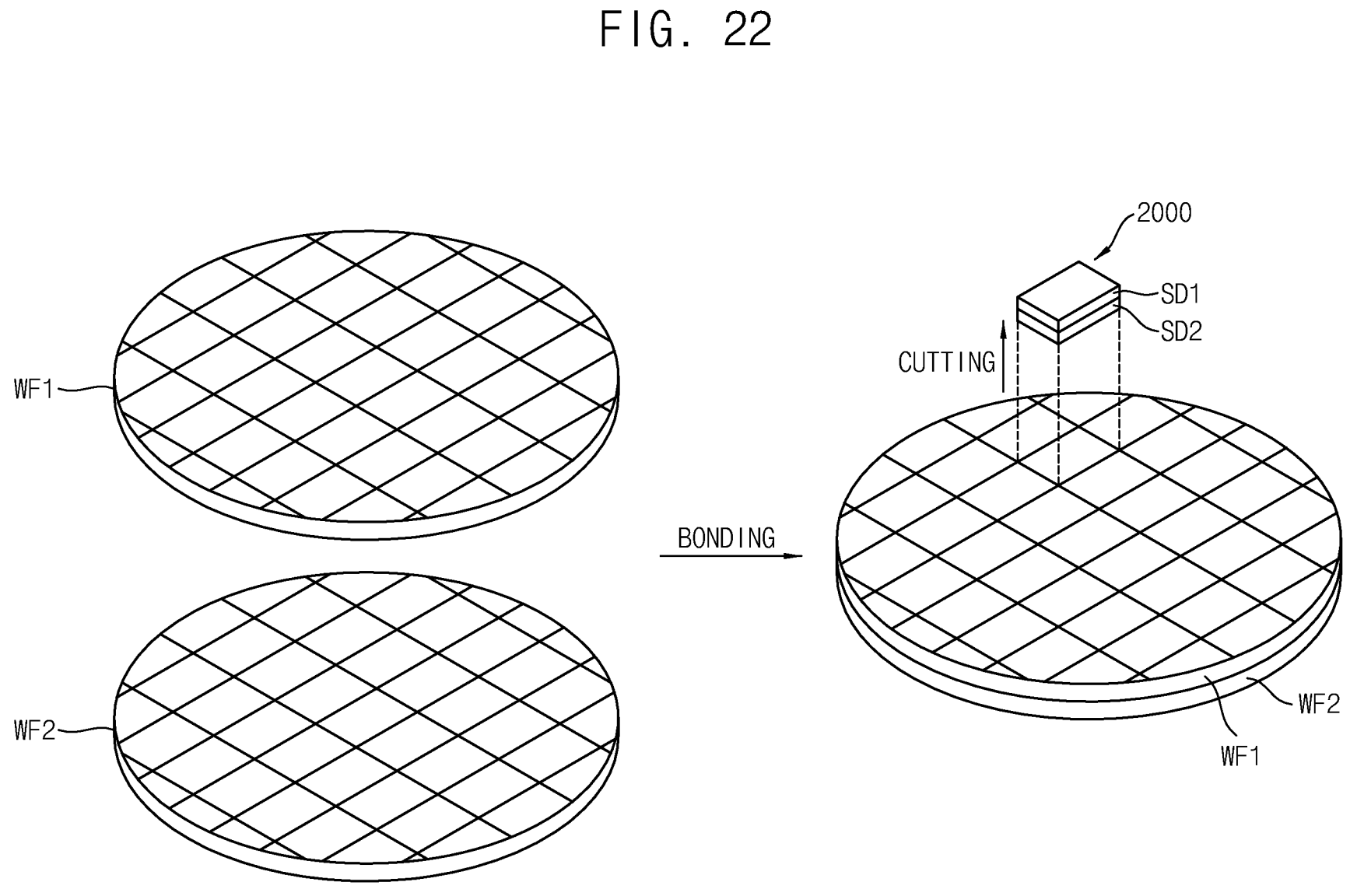

FIG. 22 is a conceptual diagram illustrating manufacturing processes of a stacked semiconductor device, according to example embodiments.

Referring to FIG. 22, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (and/or divided) into separate chips, in which each chip corresponds to a semiconductor device such as, for example, the nonvolatile memory device 2000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 may correspond to the first semiconductor die SD1 and each cut portion of the second wafer WF2 may correspond to the second semiconductor die SD2. The memory device of FIG. 21 may be manufactured according to the process of FIG. 22.

FIG. 23 is a block diagram illustrating a storage device, according to example embodiments. In some example embodiments, a storage device of FIG. 23 may be a solid state drive (SSD).

Referring to FIG. 23, an SSD 6000 may generally include nonvolatile memory devices 6100 and an SSD controller 6200.

The nonvolatile memory devices 6100 may be configured to receive a high voltage VPP. One or more of the nonvolatile memory devices 6100 may be provided as memory devices, according to the present disclosure as described above. According to embodiments of the present disclosure, the nonvolatile memory devices 6100 may reduce the peak current on the conductive path that transfers the switching source voltage through independent operation control for each switching group of the high-voltage switch circuits as described above. Malfunction of the memory device 6100 may be reduced and/or prevented.

The SSD controller 6200 may be connected to the nonvolatile memory devices 6100 via multiple channels CH1, CH2, CHl3, . . . , CHi, where i is a positive integer greater than zero (0). The SSD controller 6200 may include one or more processors 6210, a buffer memory 6220, an error correction code (ECC) circuit 6230, an advanced encryption standard (AES) engine 6240, a host interface 6250, and a nonvolatile memory interface 6260. The buffer memory 6220 may store data used to drive the SSD controller 6200.

The buffer memory 6220 may include multiple memory lines. Each memory line may store data and/or commands. The ECC circuit 6230 may calculate error correction code values of data to be programmed at a writing operation, and may correct an error of read data using an error correction code value at a read operation. In a data recovery operation, the ECC circuit 6230 may correct an error of data recovered from the nonvolatile memory devices 6100.

The AES engine 6240 may perform at least one of encryption and decryption of data input to and/or output from the SSD controller 6200 using a symmetric key algorithm. In an embodiment, the AES engine 6240 may include an encryption module and/or a decryption module. In an optional or additional embodiment, the encryption module and the decryption module may be implemented as two modules distinct from each other and/or may be combined into a single module.

As described above, the nonvolatile memory device and the method of controlling the nonvolatile memory device according to example embodiments may reduce and/or prevent malfunction of the nonvolatile memory device by reducing the peak current on the conductive path that transfers the switching source voltage through independent operation control for each switching group of high-voltage switch circuits.

The present disclosure may be applied to electronic devices and/or systems requiring transfer of high voltages such as a nonvolatile memory device. For example, the present disclosure may be applied to systems such as, but not limited to, a memory card, a solid state drive (SSD), an embedded multimedia card (eMMC), a universal flash storage (UFS), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IoT) device, an Internet of Everything (IoE) device, an e-book, a virtual reality (VR) device, an augmented reality (AR) device, a server system, an automotive driving system, and the like.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. A nonvolatile memory device, comprising:
a voltage generator configured to generate a switching source voltage;
a plurality of high-voltage switch circuits configured to generate a plurality of switch control signals based on the switching source voltage, the plurality of high-voltage switch circuits being grouped into a plurality of switching groups;
a conductive path configured to transfer the switching source voltage from the voltage generator to the plurality of high-voltage switch circuits;
a plurality of high-voltage switches configured to transfer high voltages based on the plurality of switch control signals; and
a control circuit configured to:
determine a reference number based on a peak current and a voltage drop on the conductive path transferring the switching source voltage; and control transition timing of the plurality of switch control signals independently with respect to each of the plurality of switching groups, such that a number of the plurality of switch control signals transitioning simultaneously is smaller than or equal to the reference number.

2. The nonvolatile memory device of claim 1, wherein:
the control circuit is further configured to generate a plurality of enable signals to be provided respectively to the plurality of switching groups, and
each high-voltage switch circuit of the plurality of high-voltage switch circuits is further configured to generate a corresponding switch control signal of the plurality of switch control signals in synchronization with a corresponding enable signal of the plurality of enable signals provided to a corresponding switching group of the high-voltage switch circuit.

3. The nonvolatile memory device of claim 2, wherein the control circuit is further configured to:
distribute transition time points of the plurality of enable signals by a time-division scheme such that the number of the plurality of switch control signals transitioning simultaneously is smaller than the reference number.

4. The nonvolatile memory device of claim 2, wherein the control circuit is further configured to:
distribute rising transition time points of the plurality of enable signals by a time-division scheme such that the number of the plurality of switch control signals transitioning simultaneously is smaller than the reference number.

5. The nonvolatile memory device of claim 2, wherein the control circuit is further configured to:
distribute falling transition time points of the plurality of enable signals by a time-division scheme such that the number of the plurality of switch control signals transitioning simultaneously is smaller than the reference number.

6. The nonvolatile memory device of claim 2, wherein the control circuit is further configured to:
delay a transition time point of at least one enable signal of the plurality of enable signals, when the number of the plurality of switch control signals transitioning simultaneously is greater than the reference number.

7. The nonvolatile memory device of claim 2, wherein the control circuit is further configured to:
control transition time points of the plurality of enable signals to be equal, when the number of the plurality of switch control signals transitioning simultaneously is smaller than the reference number.

8. The nonvolatile memory device of claim 1, wherein the control circuit is further configured to:
distribute transition time points of the plurality of switch control signals by units of switching groups based on an operation time point of the nonvolatile memory device.

9. The nonvolatile memory device of claim 1, wherein the control circuit is further configured to:
distribute transition time points of the plurality of switch control signals by units of switching groups based on wiring resistance on the conductive path between the voltage generator and each switching group.

10. The nonvolatile memory device of claim 1, further comprising:
a plurality of mats having a same configuration, each mat of the plurality of mats being configured to operate independently.

11. The nonvolatile memory device of claim 10, wherein high-voltage switch circuits of the plurality of high-voltage switch circuits comprised in each mat of the plurality of mats are grouped into one or more switching groups of the plurality of switching groups.

12. The nonvolatile memory device of claim 10, wherein a number of one or more switching groups comprising high-voltage switch circuits of each mat of the plurality of mats increases as a wiring resistance of the conductive path between the voltage generator and a corresponding mat of the plurality of mats is increased.

13. The nonvolatile memory device of claim 1, wherein the control circuit includes:

a plurality of delay circuits configured to generate delayed enable signals having different delay times by delaying a reference enable signal; and a plurality of multiplexers configured to generate a plurality of enable signals by selecting at least of one of the reference enable signal and the delayed enable signals.

14. The nonvolatile memory device of claim 13, wherein:

the control circuit is further configured to provide the plurality of enable signals respectively to the plurality of switching groups, and each high-voltage switch circuit of the plurality of high-voltage switch circuits is further configured to generate a corresponding switch control signal of the plurality of switch control signals in synchronization with a corresponding enable signal of the plurality of enable signals provided to a corresponding switching group of the high-voltage switch circuit.

15. The nonvolatile memory device of claim 1, wherein the nonvolatile memory device further comprises a NAND flash memory device.

16. A nonvolatile memory device, comprising:

a plurality of first bonding metal patterns in a cell region;

a plurality of second bonding metal patterns in a peripheral region disposed under the cell region, wherein the peripheral region is vertically coupled to the cell region by the plurality of first bonding metal patterns and the plurality of second bonding metal patterns;

a memory cell array in the cell region, the memory cell array comprising a plurality of memory blocks;

a voltage generator in the peripheral region, the voltage generator being configured to generate a switching source voltage;

a plurality of high-voltage switch circuits in the peripheral region, the plurality of high-voltage switch circuits being configured to generate a plurality of switch control signals based on the switching source voltage, the plurality of high-voltage switch circuits being grouped into a plurality of switching groups;

a conductive path in the peripheral region, the conductive path being configured to transfer the switching source voltage from the voltage generator to the plurality of high-voltage switch circuits;

a plurality of high-voltage switches in the peripheral region, the plurality of high-voltage switches being configured to transfer high voltages based on the plurality of switch control signals; and a control circuit in the peripheral region, the control circuit being configured to:

determine a reference number based on a peak current and a voltage drop on the conductive path transferring the switching source voltage; and control transition timing of the plurality of switch control signals independently with respect to each of the plurality of switching groups, such that a number of the plurality of switch control signals transitioning simultaneously is smaller than or equal to the reference number.

17. The nonvolatile memory device of claim 16, wherein:

the control circuit is further configured to generate a plurality of enable signals to be provided respectively to the plurality of switching groups, and each high-voltage switch circuit of the plurality of high-voltage switch circuits is further configured to generate a corresponding switch control signal of the plurality of switch control signals in synchronization with a corresponding enable signal of the plurality of enable signals provided to a corresponding switching group of the high-voltage switch circuit.

18. The nonvolatile memory device of claim 17, wherein the control circuit is further configured to:

distribute transition time points of the plurality of enable signals by a time-division scheme such that the number of the plurality of switch control signals transitioning simultaneously is smaller than the reference number.

19. A method of controlling a nonvolatile memory device, comprising:

grouping high-voltage switch circuits into a plurality of switching groups, the high-voltage switch circuits generating, based on a switching source voltage, switch control signals to control high-voltage switches;

determining a reference number based on a peak current and a voltage drop on a conductive path transferring the switching source voltage; and controlling transition timing of the switch control signals independently with respect to each switching group of the plurality of switching groups, such that a number of the switch control signals transitioning simultaneously is smaller than or equal to the reference number.

* * * * *